US009245821B2

(12) United States Patent  
Gohara et al.

(10) Patent No.: US 9,245,821 B2  
(45) Date of Patent: Jan. 26, 2016

(54) COOLING DEVICE FOR SEMICONDUCTOR MODULE, AND SEMICONDUCTOR MODULE

(71) Applicant: FUJI ELECTRIC CO., LTD., Kawasaki-shi (JP)

(72) Inventors: Hiromichi Gohara, Matsumoto (JP); Akira Morozumi, Okaya (JP); Takeshi Ichimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/347,153

(22) PCT Filed: Oct. 12, 2012

(86) PCT No.: PCT/JP2012/076453  
§ 371 (c)(1),  
(2) Date: Mar. 25, 2014

(87) PCT Pub. No.: WO2013/054887  
PCT Pub. Date: Apr. 18, 2013

(65) Prior Publication Data  
US 2014/0239486 A1    Aug. 28, 2014

(30) Foreign Application Priority Data

Oct. 12, 2011    (JP) ................................. 2011-224469  
Sep. 5, 2012    (WO) .................. PCT/JP2012/072554

(51) Int. Cl.  
*H01L 23/473*    (2006.01)  
*H01L 23/373*    (2006.01)  
(Continued)

(52) U.S. Cl.  
CPC ................ *H01L 23/473* (2013.01); *F28F 3/02* (2013.01); *F28F 3/12* (2013.01); *F28F 9/026* (2013.01);  
(Continued)

(58) Field of Classification Search  
CPC ........... H05K 7/20236; H05K 7/20254; H01L 23/473  
USPC ........................ 257/715; 165/104.33; 361/699  
See application file for complete search history.

(56) References Cited

U.S. PATENT DOCUMENTS

| 2,934,322 A | 4/1960 | Hazard |
| 5,737,186 A | 4/1998 | Fuesser et al. |

(Continued)

FOREIGN PATENT DOCUMENTS

| DE | 19514545 A1 | 10/1996 |
| EP | 2234153 A1 | 9/2010 |

(Continued)

OTHER PUBLICATIONS

PCT, "International Search Report for International Application No. PCT/JP2012/076453".

(Continued)

*Primary Examiner* — Karen Kusumakar  
*Assistant Examiner* — Adam S Bowen  
(74) *Attorney, Agent, or Firm* — Manabu Kanesaka

(57) ABSTRACT

A cooling device for a semiconductor module supplying a coolant from outside into a water jacket and cooling a semiconductor element, includes a heat sink thermally connected to the semiconductor element; a first flow channel extending from a coolant introducing port and including a guide section having an inclined surface for guiding the coolant toward one side surface of the heat sink; a second flow channel disposed parallel to the first flow channel and extending toward a coolant discharge port; a flow velocity adjusting plate disposed in the second flow channel and formed parallel to the other side surface of the heat sink at a distance therefrom; and a third flow channel formed to communicate the first flow channel and the second flow channel. The heat sink is disposed in the third flow channel.

19 Claims, 23 Drawing Sheets

(51) Int. Cl.
*H05K 7/20* (2006.01)
*F28F 3/12* (2006.01)
*F28F 9/02* (2006.01)
*F28F 3/02* (2006.01)
*H02M 7/00* (2006.01)

(52) U.S. Cl.
CPC ........ *H01L 23/3735* (2013.01); *H05K 7/20927* (2013.01); *H01L 2924/0002* (2013.01); *H02M 7/003* (2013.01)

(56) References Cited

U.S. PATENT DOCUMENTS

| | | | |
|---|---|---|---|
| 5,978,220 A * | 11/1999 | Frey et al. | 361/699 |
| 8,933,557 B2 | 1/2015 | Gohara et al. | |
| 2006/0225867 A1* | 10/2006 | Park et al. | 165/80.4 |
| 2008/0237847 A1 | 10/2008 | Nakanishi et al. | |
| 2009/0178792 A1 | 7/2009 | Mori et al. | |
| 2010/0090336 A1* | 4/2010 | Yoshida et al. | 257/717 |
| 2010/0252235 A1 | 10/2010 | Mori et al. | |
| 2013/0058041 A1 | 3/2013 | Gohara et al. | |
| 2014/0252590 A1 | 9/2014 | Gohara et al. | |

FOREIGN PATENT DOCUMENTS

| | | |
|---|---|---|
| JP | 2001-035981 A | 2/2001 |
| JP | 2001-352025 A | 12/2001 |
| JP | 2006-080211 A | 3/2006 |
| JP | 2007-012722 A | 1/2007 |
| JP | 2008-205371 A | 9/2008 |
| JP | 2010-203694 A | 9/2010 |
| JP | 2011-134979 A | 7/2011 |
| WO | 2011/018882 A1 | 2/2011 |
| WO | 2013/054615 A1 | 4/2013 |

OTHER PUBLICATIONS

Europe Patent Office, "Search Report for EP 12839889.8," Jun. 2, 2015.

Japan Patent Office, "Office Action for JP 2013-538590," Sep. 1, 2015.

* cited by examiner

FLOW CHANNEL SHAPE OF EACH TYPE (FLOW CHANNEL WIDTH W1 = W2 = 15 mm)

| SHAPE OF COOLANT FLOW CHANNEL | DIMENSIONS OF FLOW VELOCITY ADJUSTING PLATE | | | |
|---|---|---|---|---|
| | L[mm] | x2[mm] | y2[mm] | h[mm] |
| TYPE E | 175 | 0 | 2 | 9.5 |
| TYPE Ea | 175 | 0 | 2 | 7.5 |
| TYPE Eb | 175 | 0 | 2 | 5.5 |
| TYPE F | 215 | 0 | 2 | 9.5 |
| TYPE Fa | 215 | 0 | 2 | 7.5 |
| TYPE Fb | 215 | 0 | 2 | 5.5 |
| TYPE Fc | 215 | 5 | 2 | 9.5 |

Fig. 12

FLOW CHANNEL DIMENSIONS OF EACH TYPE

| SHAPE OF COOLANT FLOW CHANNEL | DIMENSIONS OF FLOW VELOCITY ADJUSTING PLATE (HERE, x2 = 0 [mm]) | | | FLOW CHANNEL WIDTH | |
|---|---|---|---|---|---|
| | L[mm] | h[mm] | y2[mm] | w1[mm] | w2[mm] |
| TYPE G | 255 | 2 | 2 | 10 | 15 |
| TYPE Ga | 255 | 4 | 2 | 10 | 15 |
| TYPE Gb | 255 | 6 | 2 | 10 | 15 |
| TYPE Gc | 255 | 8 | 2 | 10 | 15 |
| TYPE H | 255 | 8 | 2 | 15 | 15 |
| TYPE I | 255 | 8 | 2 | 12.5 | 15 |

Fig. 17

COOLING DEVICE FOR SEMICONDUCTOR MODULE, AND SEMICONDUCTOR MODULE

RELATED APPLICATIONS

The present application is National Phase of International Application No. PCT/JP2012/076453 filed Oct. 12, 2012, and claims priorities from Japanese Application No. 2011-224469 filed Oct. 12, 2011 and PCT/JP2012/072554 filed Sep. 5, 2012.

TECHNICAL FIELD

The present invention relates to a cooling device for a semiconductor module for cooling a semiconductor element, and also a semiconductor module in which a coolant is supplied from the outside into a water jacket constituting a cooling device and cools a semiconductor element disposed on the outer surface of the cooling device.

BACKGROUND ART

Semiconductor modules have been widely used in power conversion devices typically used in hybrid automobiles or electric automobiles. In such a semiconductor module constituting a control device for saving energy, a power semiconductor element is provided to control a high electric current. The usual power semiconductor element generates heat when controlling a high electric current, and the amount of generated heat increases as the size of the power conversion device is reduced and the output thereof is increased. Therefore, it is very important to ensure cooling in a semiconductor module provided with a plurality of power semiconductor elements.

Cooling apparatuses of a liquid cooling system have been used to increase the cooling efficiency of semiconductor modules. A variety of measures have been used to increase the cooling efficiency of the cooling apparatuses of a liquid cooling system, for example, by increasing the coolant flow rate, forming the heat radiating fins (cooling bodies) such that good heat transfer coefficient is obtained, and increasing thermal conductivity of the material constituting the fins.

However, when the flow rate of the coolant flowing to the cooling apparatus is increased or a complex fin shape is used that has good heat transfer coefficient, a load on the cooling pump for circulating the coolant is increased, for example, due to the increase in the pressure loss of the coolant inside the apparatus. In particular, in a cooling apparatus that cools a large number of power semiconductor elements by using a plurality of heat sinks, the increase in pressure loss becomes especially significant in a flow channel configuration in which a plurality of flow channels is connected in series. In order to reduce the pressure loss, it is ideal to use a configuration in which the cooling efficiency is increased at a small coolant flow rate. For this purpose, for example, thermal conductivity of the fin material may be modified, but using a fin material with a high thermal conductivity can increase the cost of the entire apparatus.

In order to reduce the pressure loss while maintaining the cooling performance, cooling apparatuses have been suggested (see Patent Documents 1 to 8) in which a coolant introducing flow channel for introducing the coolant and a coolant discharge flow channel for discharging the coolant are arranged parallel to each other, and a plurality of heat sinks is disposed therebetween in the coolant circulation direction that is substantially perpendicular thereto. In this case, the flows of the coolant between the fins constituting the heat sinks are parallel to each other, the cooling performance can be increased, and also the pressure loss of the coolant in the flow channels can be reduced (see Patent Document 5).

Further, Patent Document 3 describes a cooling apparatus of a liquid cooling system in which the flow channels (header water channels 11a, 11b) for introducing and discharging the liquid coolant are disposed at the same side surface of a module, and the flow channels are disposed in the direction orthogonal to the fins, without variations in the cross-section area thereof (see FIG. 1). As a result, the pressure loss generated in the liquid coolant can be greatly reduced.

Further, Patent Document 6 describes a cooling apparatus of a liquid cooling system in which the entire rear wall of the casing constituting a liquid coolant inflow section is gradually inclined forward from the right wall side to the left wall side and the cross-section area of the flow channel in the inlet header section decreases from the liquid coolant inlet side to the left wall side. As a result, it is possible to improve uniformity of flow velocity distribution in the entire flow channel of the parallel flow channel portion of the casting, that is, the flow velocity distribution in the lateral direction of the parallel flow channel portion.

Patent Document 1: Japanese Patent Application Publication No. 2001-35981 (see paragraph [0020] and FIG. 1)
Patent Document 2: Japanese Patent Application Publication No. 2007-12722 (see paragraph [0006] and FIG. 7)
Patent Document 3: Japanese Patent Application Publication No. 2008-205371 (see paragraph [0021] and FIG. 1)
Patent Document 4: Japanese Patent Application Publication No. 2008-251932 (see paragraphs [0037] and [0038] and FIG. 7)
Patent Document 5: Japanese Patent Application Publication No. 2006-80211 (see paragraph [0006] and FIG. 1)
Patent Document 6: Japanese Patent Application Publication No. 2009-231677 (see paragraphs [0024] and [0031] and FIG. 2)
Patent Document 7: Japanese Patent Application Publication No. 2006-295178 (see paragraphs [0017] to [0024] and FIG. 2)
Patent Document 8: Japanese Patent Application Publication No. 2010-203694 (see paragraph [0026] and FIG. 3)

However, with the conventional cooling technique, a drift distribution, that is, the drift of coolant flow inside the cooling device, occurs due to the shape of the heat sink of coolant flow channels, the arrangement of heat generating elements, or the shape of the coolant introducing port and discharge port. Since such drift distribution causes uneven cooling performance, it is difficult to obtain stable and uniform cooling performance in the conventional cooling apparatuses. Another problem is that the heat generation temperature of the semiconductor element disposed at a position directly opposite the coolant discharge port side rises significantly, thereby decreasing the element service life and damaging the element.

Further, if the cross-sectional area of the flow channel in the inlet header portion decreases in the extension direction, as in the cooling apparatuses disclosed in Patent Documents 6 and 7, the flow rate distribution tends to improve, but the problem of temperature increase in the vicinity of the coolant introducing port remains unsolved and the increase in pressure loss is easily induced if the flow velocity adjustment is performed by changing the shape of the introducing flow channel.

In the cooling apparatus of a liquid cooling system described in Patent Document 8, a plurality of flow channel groups that includes a plurality of flow channels and differ in path resistance is provided side by side in the lateral direction of the parallel flow channel portion in the parallel flow channel portion, and the uniformity of the flow velocity distribution in the lateral direction of the parallel flow channel portion can be improved, and the occurrence of regions where the cooling performance is reduced due to the decrease in the flow velocity can be prevented. However, stable cooling performance cannot be easily obtained due, for example, to the warping of the fin base occurring in the process of manufacturing the cooling apparatus.

DISCLOSURE OF THE INVENTION

The present invention has been created with the foregoing, and it is an object thereof to provide a cooling device for a semiconductor module in which the increase in temperature only in some of semiconductor elements can be eliminated and the semiconductor elements can be cooled uniformly and stably by adjusting the flow velocity distribution of the coolant with consideration for the drift occurring in the flow channel and the heat generation distribution among the semiconductor elements.

Another object of the present invention is to provide a semiconductor module in which the malfunction or fracture caused by heat generation in the semiconductor elements can be reliably prevented by effectively cooling the semiconductor elements.

In order to resolve the above-described problems, the present invention, according to one aspect thereof, provides a cooling device for a semiconductor module supplying a coolant from outside into a water jacket and cooling a semiconductor element disposed on an outer surface thereof. The cooling device for a semiconductor module includes a heat sink thermally connected to the semiconductor element; a first flow channel disposed inside the water jacket and extending from a coolant introducing port, the first flow channel including a guide section having an inclined surface for guiding the coolant toward one side surface of the heat sink; a second flow channel disposed inside the water jacket parallel to the first flow channel at a distance therefrom and extending toward a coolant discharge port, the second flow channel being formed with a sidewall parallel to the other side surface of the heat sink; a flow velocity adjusting plate disposed in the second flow channel and formed parallel to the other side surface of the heat sink at a distance therefrom; and a third flow channel formed at a position communicating the first flow channel and the second flow channel inside the water jacket. The heat sink is disposed in the third flow channel.

Further, the semiconductor module in accordance with the present invention is a semiconductor module supplying a coolant from outside into a water jacket configuring a cooling device and cooling a semiconductor element disposed on an outer surface of the cooling device. The semiconductor module includes a heat sink thermally connected to the semiconductor element; a first flow channel disposed inside the water jacket and extending from a coolant introducing port, the first flow channel including a guide section having an inclined surface for guiding the coolant toward one side surface of the heat sink; a second flow channel disposed inside the water jacket parallel to the first flow channel at a distance therefrom and extending toward a coolant discharge port, the second flow channel being formed with a sidewall parallel to the other side surface of the heat sink; a flow velocity adjusting plate disposed in the second flow channel and formed parallel to the other side surface of the heat sink at a distance therefrom; and a third flow channel formed at a position communicating the first flow channel and the second flow channel inside the water jacket. The coolant introducing port and the coolant discharge port are formed in a same wall surface of the water jacket, and the heat sink is disposed in the third flow channel.

According to another aspect, there is provided a cooling device for a semiconductor module supplying a coolant from outside into a water jacket and cooling a semiconductor element disposed on an outer surface thereof. This cooling device for a semiconductor module includes a heat sink adapted to be thermally connected to the semiconductor element; a first flow channel disposed inside the water jacket and extending from a coolant introducing port, the first flow channel including a plurality of guide sections having mutually different inclined surfaces for guiding the coolant toward one side surface of the heat sink; a second flow channel disposed inside the water jacket parallel to the first flow channel at a distance therefrom and extending toward a coolant discharge port, the second flow channel being formed with a sidewall parallel to the other side surface of the heat sink; a flow velocity adjusting plate disposed in the second flow channel and formed parallel to the other side surface of the heat sink at a distance therefrom; and a third flow channel formed at a position communicating the first flow channel and the second flow channel inside the water jacket. The heat sink is disposed in the third flow channel.

Further, the semiconductor module in accordance with the present invention is a semiconductor module supplying a coolant from outside into a water jacket configuring a cooling device and cooling a semiconductor element disposed on an outer surface of the cooling device. The semiconductor module includes a heat sink thermally connected to the semiconductor element; a first flow channel disposed inside the water jacket and extending from a coolant introducing port, the first flow channel including a plurality of guide sections having mutually different inclined surfaces for guiding the coolant toward one side surface of the heat sink; a second flow channel disposed inside the water jacket parallel to the first flow channel at a distance therefrom and extending toward a coolant discharge port, the second flow channel being formed with a sidewall parallel to the other side surface of the heat sink; a flow velocity adjusting plate disposed in the second flow channel and formed parallel to the other side surface of the heat sink at a distance therefrom; and a third flow channel formed at a position communicating the first flow channel and the second flow channel inside the water jacket. The coolant introducing port and the coolant discharge port are formed in a same wall surface of the water jacket, or the coolant discharge port is formed at a position diagonally opposite a position of the coolant introducing port in the water jacket, and the heat sink is disposed in the third flow channel.

According to yet another aspect, there is provided a cooling device for a semiconductor module supplying a coolant from the outside into a water jacket and cooling a semiconductor element disposed on an outer surface thereof. This cooling device for a semiconductor module includes a heat dissipating device thermally connected to the semiconductor element; a first flow channel device disposed inside the water jacket and extending from a coolant introducing port, the first flow channel including a guide device having an inclined surface for guiding the coolant toward one side surface of the heat dissipating device; a second flow channel device disposed inside the water jacket parallel to the first flow channel device at a distance therefrom and extending toward a coolant discharge port, the second flow channel device being formed with a sidewall parallel to the other side surface of the heat dissipating device; a flow velocity adjusting device disposed in the second flow channel device and formed parallel to the other side surface of the heat dissipating device at a distance therefrom; and a third flow channel device formed at a position communicating the first flow channel device and the second flow channel device inside the water jacket. The heat dissipating device is disposed in the third flow channel device.

Further, the semiconductor module in accordance with the present invention is a semiconductor module supplying a coolant from outside into a water jacket configuring a cooling device and cooling a semiconductor element disposed on an outer surface of the cooling device. The semiconductor module includes a heat dissipating device thermally connected to the semiconductor element; a first flow channel device disposed inside the water jacket and extending from a coolant introducing port, the first flow channel device including a guide device having an inclined surface for guiding the coolant toward one side surface of the heat dissipating device; a second flow channel device disposed inside the water jacket parallel to the first flow channel device at a distance therefrom and extending toward a coolant discharge port, the second flow channel device being formed with a sidewall parallel to the other side surface of the heat dissipating device; a flow velocity adjusting device disposed in the second flow channel device and formed parallel to the other side surface of the heat dissipating device at a distance therefrom; and a third flow channel device formed at a position communicating the first flow channel device and the second flow channel device inside the water jacket. The coolant introducing port and the coolant discharge port are formed in a same wall surface of the water jacket, and the heat dissipating device is disposed in the third flow channel device.

According to yet another aspect, there is provided a cooling device for a semiconductor module supplying a coolant from the outside into a water jacket and cooling a semiconductor element disposed on an outer surface thereof. This cooling device for a semiconductor module includes a heat dissipating device thermally connected to the semiconductor element; a first flow channel device disposed inside the water jacket and extending from a coolant introducing port, the first flow channel device including a plurality of guide device having mutually different inclined surfaces for guiding the coolant toward one side surface of the heat dissipating device; a second flow channel device disposed inside the water jacket parallel to the first flow channel device at a distance therefrom and extending toward a coolant discharge port, the second flow channel device being formed with a sidewall parallel to the other side surface of the heat dissipating device; a flow velocity adjusting device disposed in the second flow channel device and formed parallel to the other side surface of the heat dissipating device at a distance therefrom; and a third flow channel device formed at a position communicating the first flow channel device and the second flow channel device inside the water jacket. The heat dissipating device is disposed in the third flow channel device.

Further, the semiconductor module in accordance with the present invention is a semiconductor module supplying a coolant from outside into a water jacket configuring a cooling device and cooling a semiconductor element disposed on an outer surface of the cooling device. The semiconductor module includes a heat dissipating device thermally connected to the semiconductor element; a first flow channel device disposed inside the water jacket and extending from a coolant introducing port, the first flow channel including a plurality of guide device having mutually different inclined surfaces for guiding the coolant toward one side surface of the heat dissipating device; a second flow channel device disposed inside the water jacket parallel to the first flow channel device at a distance therefrom and extending toward a coolant discharge port, the second flow channel device being formed with a sidewall parallel to the other side surface of the heat dissipating device; a flow velocity adjusting device disposed in the second flow channel device and formed parallel to the other side surface of the heat dissipating device at a distance therefrom; and a third flow channel device formed at a position communicating the first flow channel device and the second flow channel device inside the water jacket. The coolant introducing port and the coolant discharge port are formed in a same wall surface of the water jacket, or the coolant discharge port is formed at a position diagonally opposite the position of the coolant introducing port in the water jacket, and the heat dissipating device is disposed in the third flow channel device.

With the cooling device for a semiconductor module and the semiconductor module in accordance with the present invention, the flow velocity of the coolant flowing from the first flow channel to one side surface of the heat sink can be adjusted by disposing the flow velocity adjusting plate parallel to the other side surface of the heat sink at a distance therefrom in the second flow channel extending toward the coolant discharge port. Further, the flow velocity distribution of the coolant flowing into the heat sink can be adjusted by additionally using a guide section having an inclined surface in the first flow channel. Therefore, the semiconductor element disposed at the outer surface of the cooling device can be effectively cooled and stable operation of the semiconductor element is enabled.

The above-described and other objectives, features and advantages of the present invention will become apparent from the following description taken in conjunction with the appended drawings illustrating the preferred embodiments as examples of the present invention.

BRIEF DESCRIPTION OF THE DRAWINGS

FIGS. 4(A), 4(B) illustrate two shapes of fins, in which FIG. 4(A) is a perspective view illustrating blade fins, and FIG. 4(B) is a perspective view illustrating corrugate fins.

FIGS. 6(A), 6(B) illustrate the conventional semiconductor module as the first comparative example, in which FIG. 6(A) is a perspective view illustrating an arrangement example of circuit elements, and FIG. 6(B) is a perspective view illustrating the principal configuration of the water jacket of the cooling device.

FIGS. 8(A), 8(B) illustrate the conventional semiconductor module as the fourth comparative example, in which FIG. 8(A) is a plan view illustrating the shape of the water jacket, and FIG. 8(B) is a partial perspective view thereof.

FIG. 12 is an explanatory drawing illustrating, for each type, the dimensions of the flow velocity adjusting plate in the cooling device for a semiconductor module shown in FIG. 11.

FIG. 17 is an explanatory drawing showing, for each type, the dimensions of the flow velocity adjusting plate and the flow channel width in the introducing port and discharge port in the cooling device for a semiconductor module shown in FIG. 16.

BEST MODE FOR CARRYING OUT THE INVENTION

Figure 1:
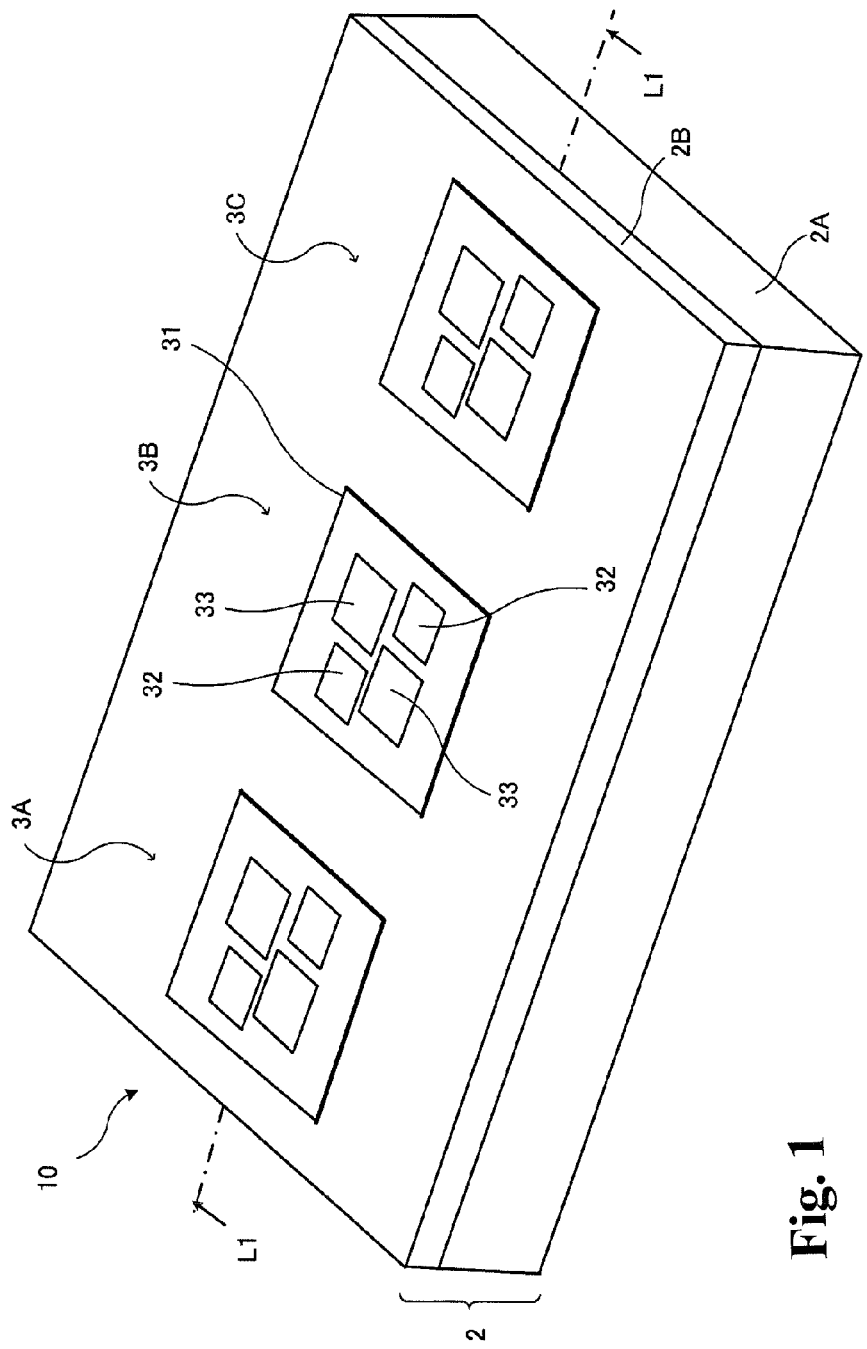
FIG. 1 is a perspective view illustrating the external appearance of an example of a semiconductor module in accordance with the present invention.
Figure 2:
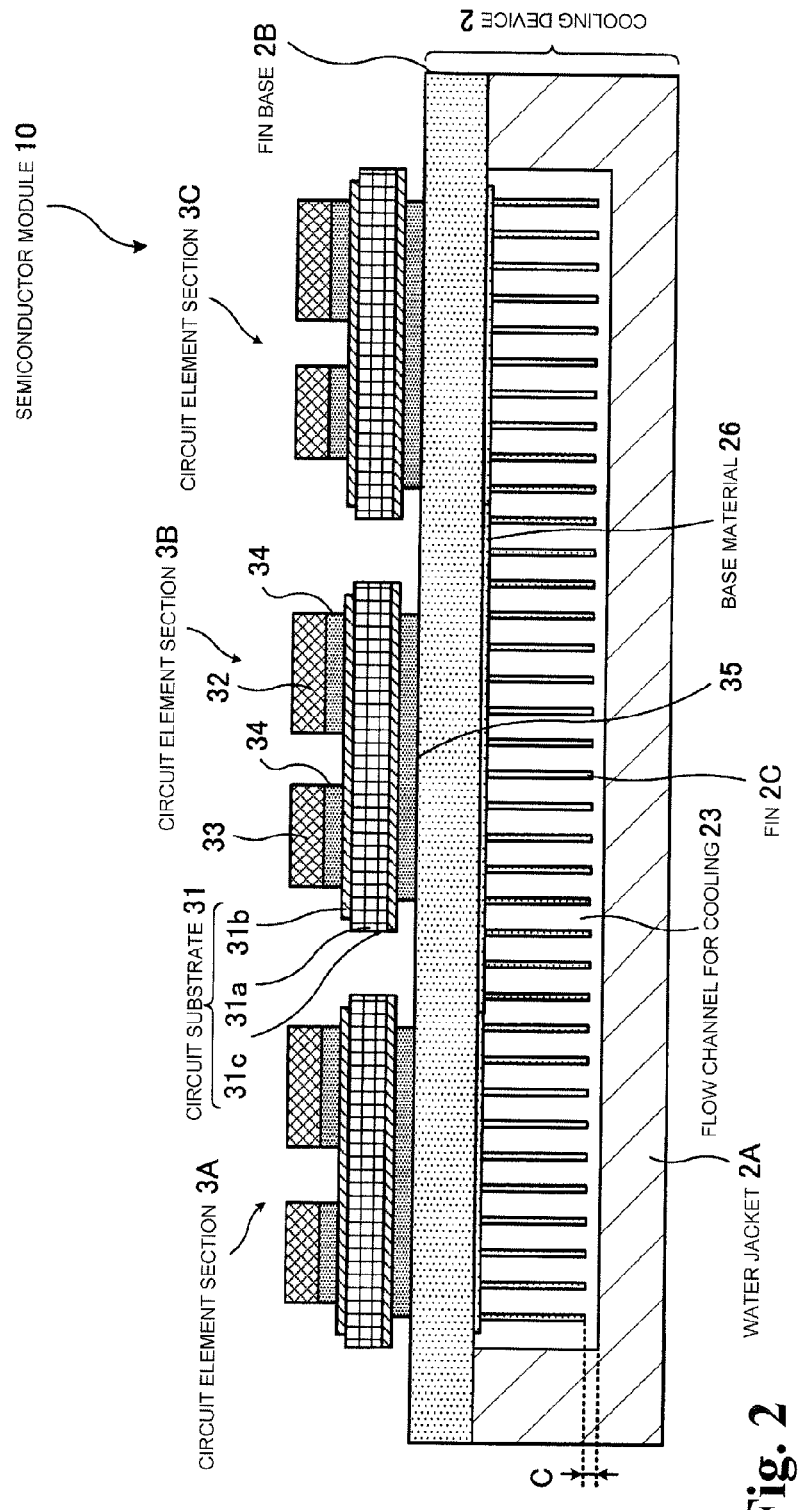
FIG. 2 is a cross-sectional view of the semiconductor module shown in FIG. 1 which is taken along the line L1-L1.
Figure 3:
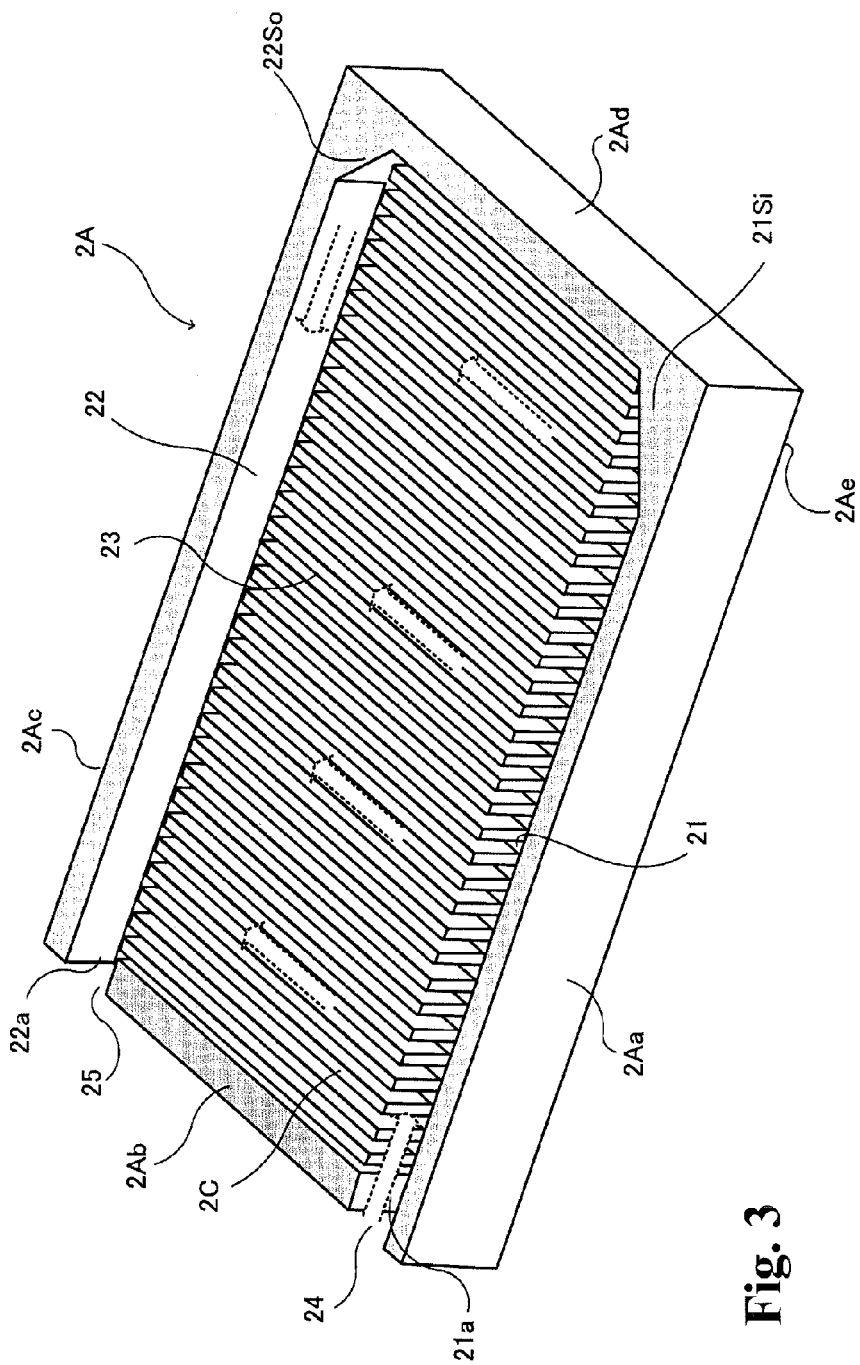
FIG. 3 is a perspective view illustrating the principal configuration of the water jacket of a cooling device.

FIG. 1 is a perspective view illustrating an external appearance of an example of a semiconductor module in accordance with the present invention. FIG. 2 is a cross-sectional view of the semiconductor module shown in FIG. 1 which is taken along the line L1-L1, and FIG. 3 is a perspective view illustrating the principal configuration of the water jacket of a cooling device in the semiconductor module. Arrows in FIG. 3 show the direction in which a coolant flows.

As shown in FIG. 1 and FIG. 2, a semiconductor module 10 is constituted by a cooling device 2 and a plurality of circuit element sections 3A to 3C disposed on the cooling device 2. The cooling device 2 is constituted by a water jacket 2A as a fin cover and a fin base 2B in which a plurality of fins 2C is implanted as a heat sink. The cooling device is configured such that the plurality of fins 2C is accommodated inside the water jacket 2A.

In the explanation below, with respect to the water jacket 2A and the fins 2C accommodated inside thereof, the side shown in FIG. 2 to which the fin base 2B is attached will be referred to as "upper side", the direction of the arrow on the upper side of the water jacket 2A in FIG. 3 will be referred to as "front side", and the side where a coolant introducing port section 21a and a coolant discharge port section 22a are formed will be referred to as "left side". Concerning the coolant flow inside the cooling device 2, the side close to an introducing port 24 will be referred to as "upstream side".

As shown in FIG. 3, the water jacket 2A of the cooling device 2 has a substantially rectangular parallelepiped shape. A coolant introducing flow channel 21, the introducing port section 21a, a coolant discharge flow channel 22, the discharge port section 22a, and a flow channel 23 for cooling that has the fins 2C disposed therein are provided at the main surface on the upper side of the water jacket. The introducing port 24 for introducing the coolant into the water jacket and a discharge port 25 for discharging the coolant to the outside are provided in the left wall 2Ab of the water jacket 2A. The coolant introducing flow channel 21 and the like are defined by a front wall 2Aa, a left wall 2Ab, a rear wall 2Ac, a right wall 2Ad, and a bottom wall 2Ae. The fins 2C are depicted in the drawing for the sake of convenience of explanation.

The coolant introducing flow channel 21 extends as a first flow channel along the coolant inflow direction from the introducing port 24 via the introducing port section 21a to the right wall 2Ad in parallel with the front wall 2Aa of the water jacket 2A. The coolant discharge flow channel 22 extends as a second flow channel along the coolant discharge port 25 from the right wall 2Ad to the discharge port section 22a in parallel with the rear wall 2Ac of the water jacket 2A. Those coolant introducing flow channel 21 and the coolant discharge flow channel 22 are provided linearly and substantially parallel to each other inside the water jacket 2A. Guide sections 21Si, 22So having an angle of inclination equal to or less than 60° are respectively formed in the terminating end section of the coolant introducing flow channel 21 into which the coolant flows from the introducing port 24 and the starting end section of the coolant discharge flow channel 22 from which the coolant is discharged to the discharge port 25.

The flow channel 23 for cooling is provided as a third flow channel in the intermediate position of the coolant introducing flow channel 21 and the coolant discharge flow channel 22 and formed to communicate the coolant introducing flow channel 21 with the coolant discharge flow channel 22. Thus, the flow channel 23 for cooling extends in the direction perpendicular to the extension direction of the coolant introducing flow channel 21 and the extension direction of the coolant discharge flow channel 22. The inner surface of the left wall 2Ab and the inner surface of the right wall 2Ad defining the boundary of the flow channel 23 for cooling are formed orthogonally to the bottom surface of the flow channel 23 for cooling and the inner surface of the rear wall 2Ac, respectively.

A heat sink constituted by a plurality of fins 2C implanted in the base material 26 is disposed in the flow channel 23 for cooling, and the coolant flows in each of the flow channels defined by those fins 2C. The coolant introduced from the introducing port 24 flows through the coolant introducing flow channel 21, flow channel 23 for cooling, and coolant discharge flow channel 22 inside the water jacket 2A and is discharged from the discharge port 25. The heat sink has a substantially rectangular parallelepiped outer shape and is installed in the flow channel 23 for cooling so that the left side surface, rear side surface, and right side surface of the heat sink are parallel to the inner surfaces of the left wall 2Ab, rear wall 2Ac, and right wall 2Ad.

The water jacket 2A having such a configuration can be formed using a metal material, for example, aluminum, an aluminum alloy, copper, and a copper alloy. Where the water jacket 2A is formed using such a metal material, the above-described coolant introducing flow channel 21, coolant discharge flow channel 22, flow channel 23 for cooling, introducing port 24, and discharge port 25 can be formed, for example, by die casting. A material containing a carbon filler can be also used for the water jacket 2A. Depending of the type of the coolant and the temperature of the coolant flowing inside the water jacket 2A, a ceramic material or a resin material can be also used.

In the water jacket 2A having such a configuration, the formation surface sides of the coolant introducing flow channel 21, coolant discharge flow channel 22, and plurality of flow channels 23 for cooling are sealed, as shown in FIG. 1 and FIG. 2, by the fin base 2B, with the exception of the coolant introducing port 24 and the coolant discharge port 25. Further, the base material 26 having the plurality of fins 2C implanted therein is joined to the fin base 2B on the water jacket 2A side.

The shape of the fins 2C constituting the cooling device 2 will be explained below.

Figure 4:
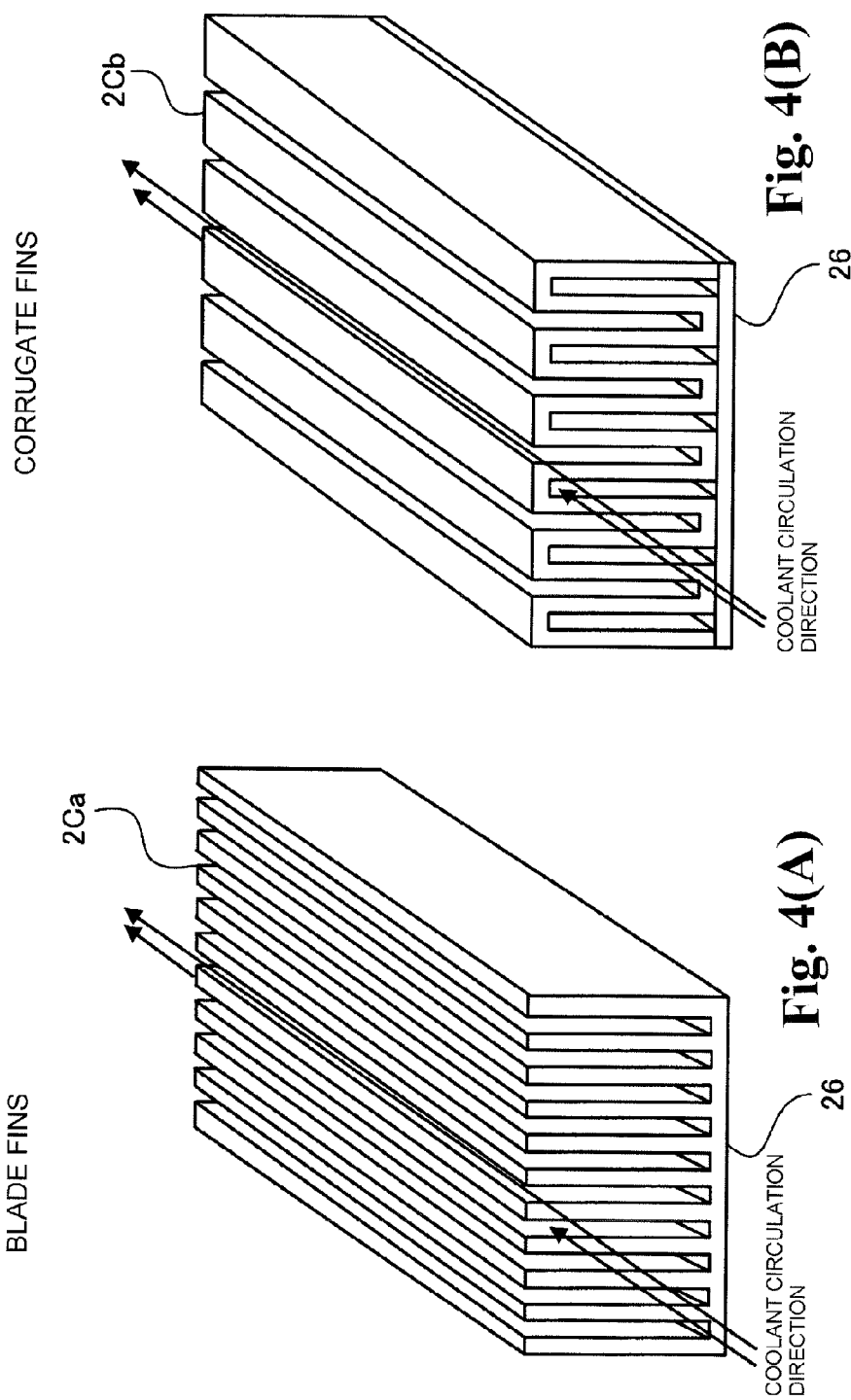

FIGS. 4(A), 4(B) illustrate two shapes of fins. FIG. 4(A) is a perspective view illustrating blade fins, and FIG. 4(B) is a perspective view illustrating corrugate fins.

The fins 2C of the cooling device 2 can be formed as a plurality of blade fins 2Ca constituted by plate-shaped fins arranged side by side, for example, as shown in FIG. 4(A). The blade fins 2Ca are disposed in the flow channel 23 for cooling, and the coolant flows therethrough in the direction shown by an arrow in FIG. 4(A). In this case, such blade fins 2Ca are held by the base material 26 and the fin base 2B inside the coolant flow channel 20b.

FIG. 4(A) shows the blade fins 2Ca by way of example, but the corrugate fins 2Cb shown in FIG. 4(B) can be also used.

The fins 2C having the shape of such blade fins 2Ca or corrugate fins 2Cb are integrated with the fin base 2B and disposed toward the water jacket 2A on the fin 2C side, for example, as shown in FIG. 2. The fins 2C are formed to have the dimensions (height) such that a constant clearance C is present between the distance ends of the fins and the bottom wall 2Ae of the water jacket 2A.

In FIG. 2, the base material 26 is configured integrally with the fin base 2B, and when the base material is disposed such that the fin 2C side of the fin base 25 faces the water jacket 2A, the fins 2C are disposed inside the flow channel 23 for cooling of the water jacket 2A. The fins 2C are formed integrally with the fin base 2B itself by die casting, soldering, or welding of various types. Alternatively, the fins 2C can be formed as protrusions from the fin base 2B by die casting or pressing and then machined to the desired fin shape by cutting or wire cutting.

Fins of a variety of conventional well-known shapes can be used as such fins 2C. Since the fins 2C offer resistance to the coolant flowing inside the flow channel 23 for cooling, the fins with a small pressure loss with respect to the coolant are preferred. The shape and dimensions of the fins 2C are preferably set, as appropriate, with consideration for the conditions of coolant introduction into the cooling device 2 (that is, pump performance and the like), coolant type (viscosity, and the like), and the target heat dissipation amount.

The heat sink constituted by the fins 2C may have a substantially rectangular parallelepiped outer shape, preferably rectangular parallelepiped shape, and the outer shape thereof can be chamfered or deformed without adversely affecting the effect of the invention.

Similarly to the water jacket 2A, the fins 2C and the fin base 2B can be formed using a metal material, for example, aluminum, an aluminum alloy, copper, and a copper alloy. In addition to the above-described blade fins 2Ca and corrugate fins 2Cb, the fins 2C can be also formed, for example, by joining predetermined pins or plates formed using a metal material to the metal base material 26.

The base material 26 having the fins 2C thus implanted therein is joined to a predetermined region of the tin base 2B such as a metal plate, that is, to the region corresponding to the flow channel 23 for cooling shown in FIG. 2. In addition to such a configuration in which the base material 26 into which the fins 2C have been implanted in advance is joined to the fin base 2B, it is also possible to configure the heat sink by joining the plurality of fins 2C directly to the fin base 2B.

When the cooling device 2 is used, for example, the introducing port 24 is connected to a pump provided on the upstream side of the cooling device and the discharge port 25 is connected to a heat exchanger provided on the downstream side thereof, thereby configuring a close-loop coolant flow channel including those cooling device 2, pump, and heat exchanger. The coolant is forcibly circulated by the pump inside such a closed loop.

For example, as shown in FIG. 2, each of the circuit element sections 3A to 3C has a total of four semiconductor elements, two types of semiconductor elements 32, 33 and two of each element, on a substrate 31. The substrate 31 has a configuration, for example, as shown in FIG. 2, in which conductive patterns 31b, 31c are formed on two surfaces of an insulating substrate 31a.

For example, a ceramic substrate from aluminum nitride or aluminum oxide can be used as the insulating substrate 31a of the substrate 31. The conductive patterns 31b, 31c on the insulating substrate 31a can be formed using a metal (for example, a copper foil) such as copper or aluminum.

Semiconductor elements 32, 33 are joined to the substrate 31 on the conductive pattern 31b side by using a joining layer 34 such as a solder and electrically connected, directly of by a wire (not shown in the figure), to the conductive pattern 31b. The substrate 31 carrying the semiconductor elements 32, 33 is joined to the fin base 2B of the cooling device 2 by a joining layer 35 at the other side of the conductive pattern 31c.

The substrate 31 and the semiconductor elements 32, 33 carried on the substrate 31 are thermally connected to the cooling device 2. The exposed surfaces of the conductive patterns 31b, 31c, or the wire surfaces electrically connecting the semiconductor elements 32, 33 and the conductive pattern 31b may be provided with a protective layer for protecting those surfaces from contamination, corrosion, or external forces, for example, by nickel plating.

Figure 5:
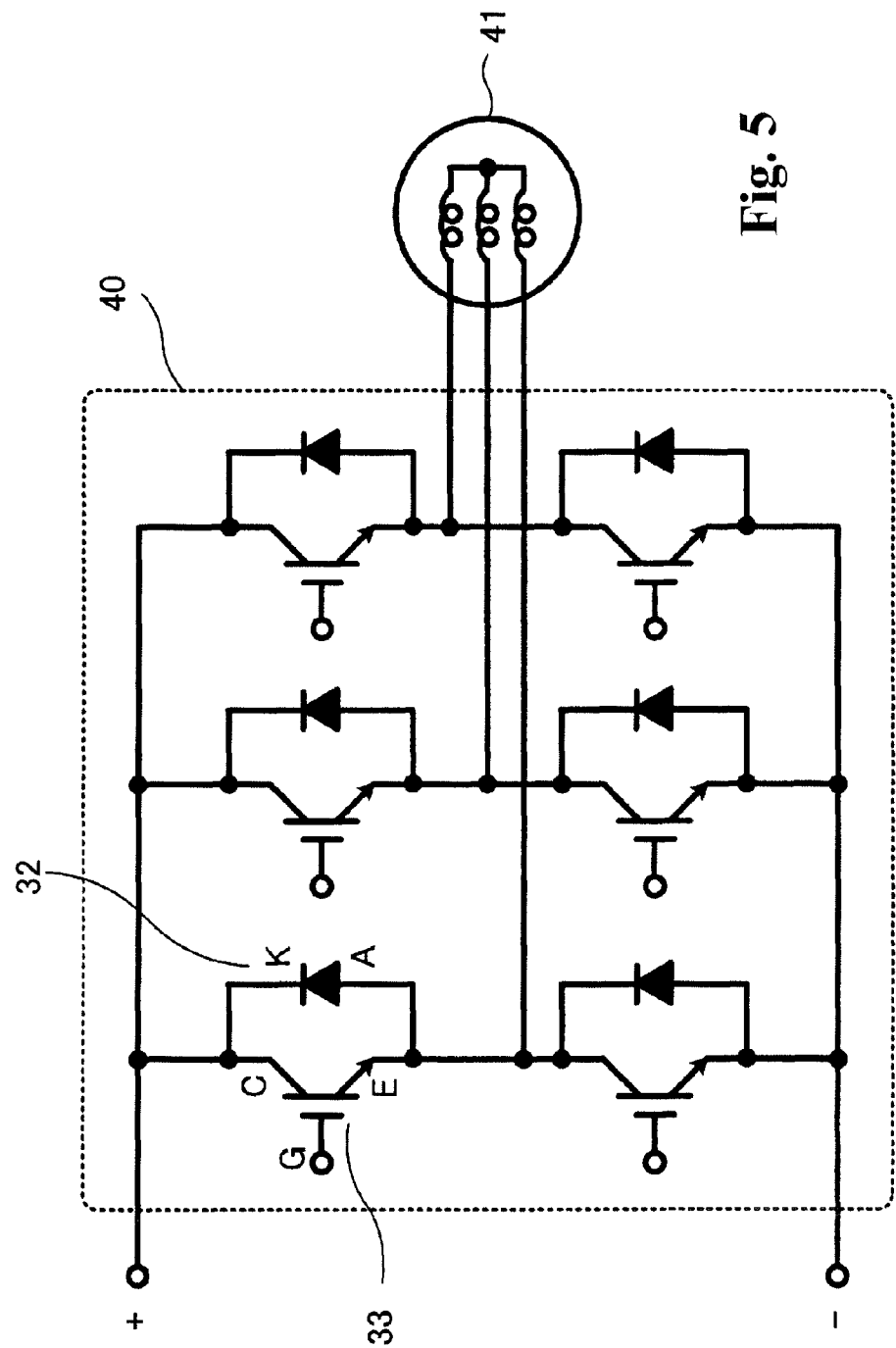
FIG. 5 illustrates an example of a power conversion circuit configured as a semiconductor module.

FIG. 5 illustrates an example of a power conversion circuit configured as a semiconductor module.

In this configuration, power semiconductor elements are used as the semiconductor elements 32, 33 carried on the substrate 31. As an example, as shown in FIG. 5, one semiconductor element 32 can be a free wheel diode (FWD) and the other semiconductor element 33 cam be an insulated gate bipolar transistor (IGBT).

In the semiconductor module 10, an inverter circuit 40 can be configured, for example, by three circuit element sections 3A to 3C.

FIG. 5 shows by way of example the inverter circuit 40 that converts a direct current into an alternating current and supplies the alternating current to a three-phase AC motor 41. The inverter circuit 40 is provided with a bridge circuit including the semiconductor element 33, which is an IGBT, and the semiconductor element 32, which is a FWD, for each of the three phases: U phase, V phase, and W phase. By performing switching control of the semiconductor element 33, it is possible to convert the direct current into the alternating current and drive the three-phase AC motor 41.

In this case, the circuit element sections 3A to 3C having such a configuration are disposed on the fin base 2B of the cooling device 2. The circuit element sections 3A to 3C can be connected, for example, such as to configure an inverter circuit on the cooling device 2.

When such power conversion circuit operates, the heat generated by the circuit element sections 3A to 3C is transferred to the fin base 2B joined thereto, and then transferred to the fins 2C located therebelow. Since the fins 2C are disposed inside the flow channel 23 for cooling, as mentioned hereinabove, the fins 2C are cooled by the coolant flowing through in the flow channel 23 for cooling. The heat-generating circuit element sections 3A to 3C are thus cooled by the cooling device 2.

In the explanation above, the configuration having three circuit element sections 3A to 3C of the semiconductor module 10 was considered by way of example. However, the number of the circuit element sections should not necessarily be limited to three, as demonstrated by the semiconductor module shown in FIG. 6(A) as a comparative example.

Comparative Example

Figure 6A:
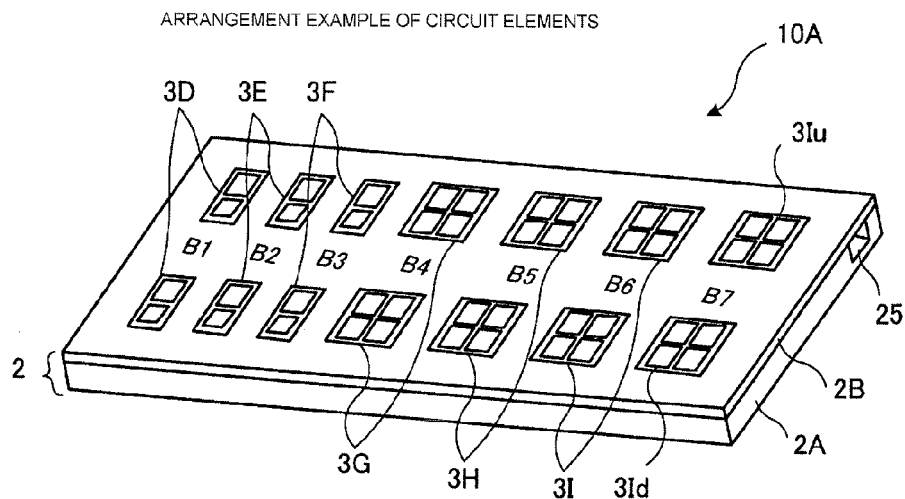
Figure 6B:
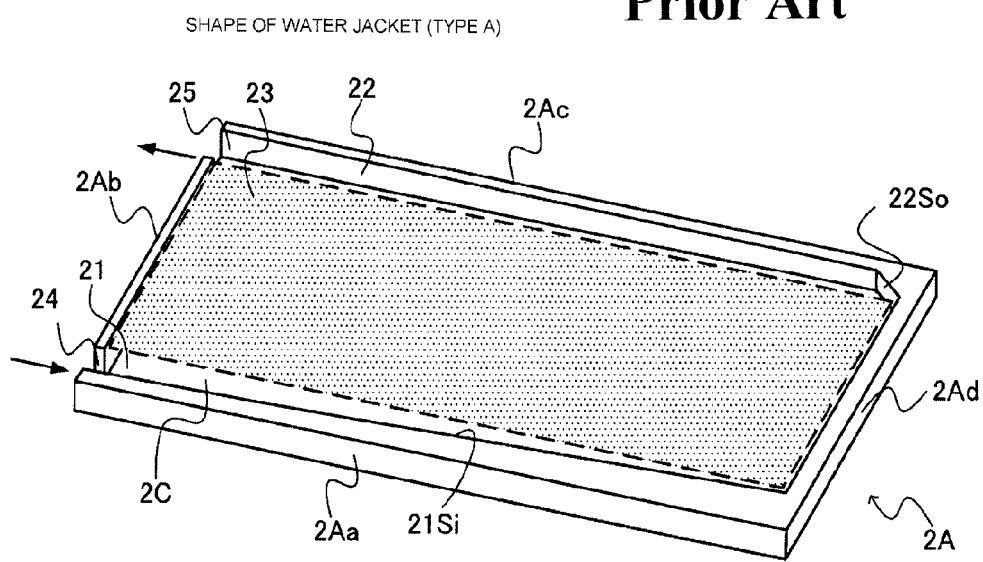

FIGS. 6(A), 6(B) illustrate the conventional semiconductor module as the first comparative example. FIG. 6(A) is a perspective view illustrating an arrangement example of circuit element, and FIG. 6(B) is a perspective view illustrating the principal configuration of the water jacket (type A) of the cooling device.

In a semiconductor module 10A shown in FIG. 6(A), a total of 14 circuit element sections 3D to 3I, 3Iu and 3Id are disposed in 7 columns (B1 to B7) in the longitudinal direction and in two rows in the lateral direction of the cooling device 2. By combining, as appropriate, those circuit element sections 3D to 3I, 3Iu and 3Id, it is possible to ensure the connection such that a plurality of inverter circuits 40 shown by way of example in FIG. 5 is configured.

In the water jacket 2A of type A shown in FIG. 6(B), the coolant introducing flow channel 21, the coolant discharge flow channel 22, and the flow channel 23 for cooling (this flow channel is located in the rectangular region shown by a broken line) are provided at one main surface side, and among those flow channels, the flow channel 23 for cooling is formed to a size corresponding to the fins 2C. The fins 2C are integrated with the fin base 2B and disposed such that the fins 2C face the water jacket 2A, for example, as shown in FIG. 2. Finally, the fin base 2B integrated with the fins 2C is disposed inside the water jacket 2A as shown in FIG. 1 and FIG. 2.

The fin base 2B and the water jacket 2A are joined using, for example, an appropriate sealing material (not shown in the figure). As a result, the cooling device 2 provided with the water jacket 2A, fin base 2B, and fins 2C can be configured. In this case, the guide sections 21Si, 22So having an angle of inclination equal to or less than 60° are formed in the terminating end section for the coolant flowing from the introducing port 24 into the coolant introducing flow channel 21 and the starting end section of the coolant discharge flow channel 22 from which the coolant is discharged to the discharge port 25. In the guide section 21Si, a uniform tilted surface is formed over the entire region facing the flow channel 23 for cooling.

Figure 7A:
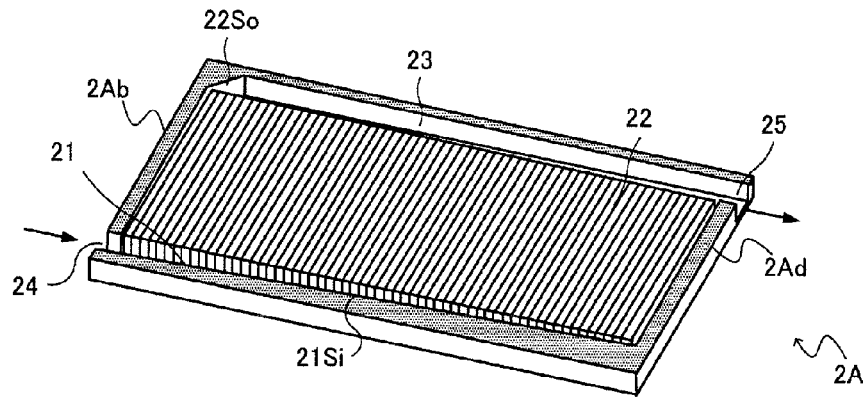
FIGS. 7(A), 7(B) are perspective views illustrating, as the second and third comparative examples, the shape of the water jacket of the types different from that of the cooling device shown in FIG. 6(B).
Figure 7B:
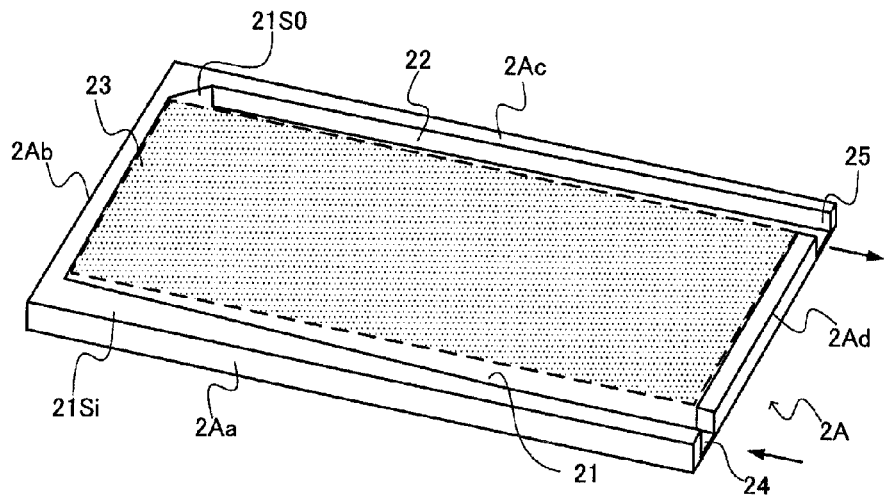

FIGS. 7(A) and 7(B) are perspective views illustrating the shapes of water jackets of types different from that of the cooling device shown in FIG. 6(B), those water jackets representing the second and third comparative examples.

FIG. 6(B) shows type A in which the introducing port 24 and the discharge port 25 are disposed at the same surface side for the left wall 2Ab. However, a plurality of shapes can be used that differs by the method for connecting the pipes for introducing and discharging the coolant, for example, such as type B shown in FIG. 7(A) in which the introducing port 24 and the discharge port 25 are disposed at the directly opposite positions of the left and right walls 2Ab, 2Ad that face each other, and type C shown in FIG. 7(B) in which the introducing port 24 and the discharge port 25 are disposed at the right wall 2Ad. Therefore, in the water jacket 2A that is to be actually used, the shape of the coolant flow channel should be optimized for each shape of the water jacket.

Figures 8A, 8B:
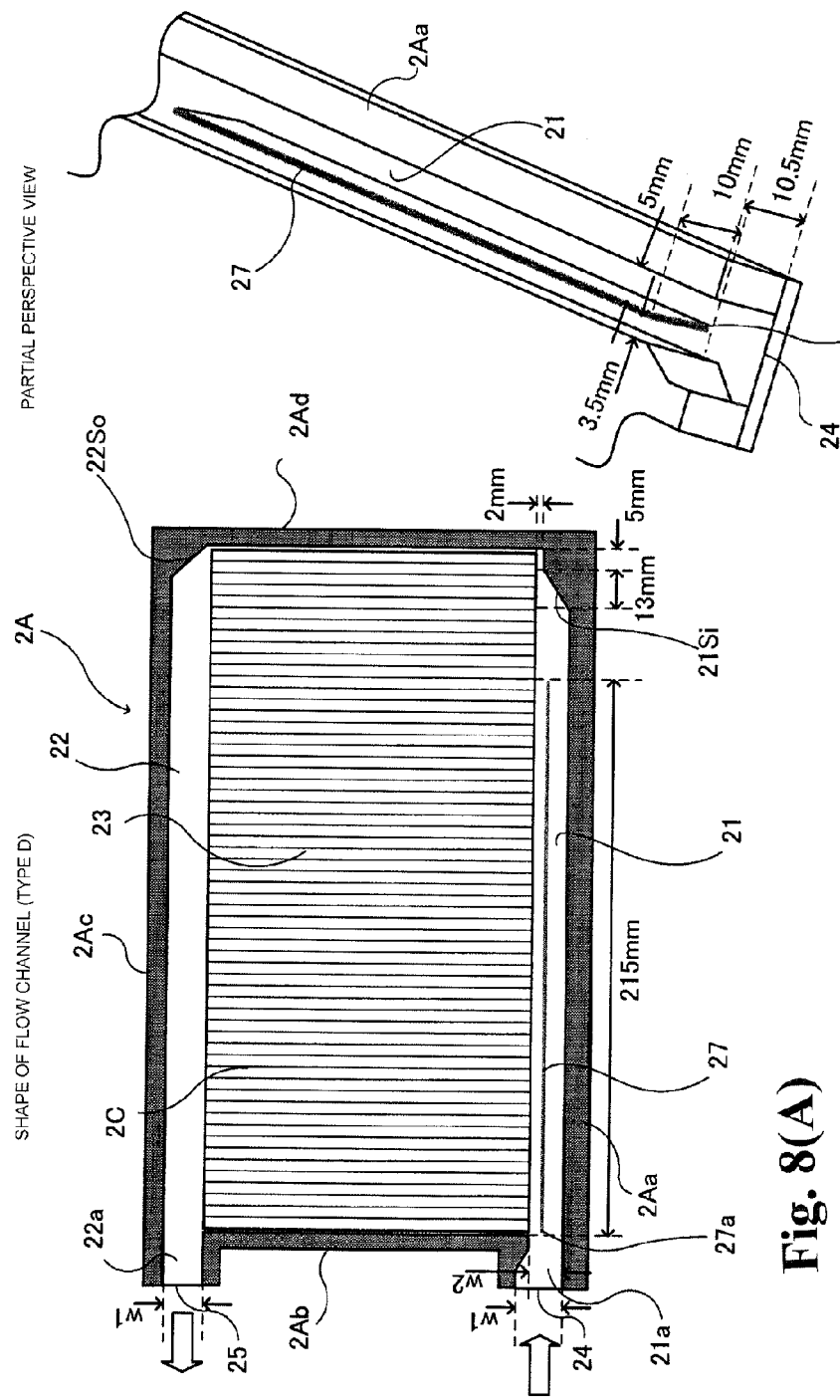

FIGS. 8(A), 8(B) illustrate the conventional semiconductor module as the fourth comparative example. FIG. 8(A) is a plan view illustrating the shape of the water jacket, FIG. 8(B) is a partial perspective view thereof.

FIGS. 8(A), 8(B) show a water jacket which is a modification example (type D) of the water jacket of type A, which is shown in FIGS. 6(A), 6(B), and obtained therefrom by changing the width of the introducing port 24 thereof and disposing a separation wall 27 inside the coolant introducing flow channel 21.

Thus, in the water jacket 2A of type D, the flow channel width of the introducing port section 21a is changed so that the cross section of the introducing port section 21a through which the coolant is guided to the coolant introducing flow channel 21 is formed in a tapered shape and a flow channel width w2 in the starting end section of the coolant introducing flow channel 21 is less than the flow channel width w1 in the introducing port 24. Further, in the water jacket 2A of type D, the guide section 21Si having an inclined portion with a length of 13 mm and a flat portion with a length of 5 mm is disposed in the terminating end section of the coolant introducing flow channel 21. In addition, the separation wall 27 is formed inside the coolant introducing flow channel 21 so that the flow channel from the starting end section is divided in two. The separation wall 27 is disposed with respect to the fins 2C inside the flow channel 23 for cooling, so as to be parallel to the side surface on the coolant introducing side thereof.

In this configuration, the separation wall 27 disposed in the coolant introducing flow channel 21 has a total length of 215 mm inside the coolant introducing flow channel 21 and is provided such that the flow channel thereof formed to a width of 10 mm is divided into two flow channels, one with a width of 3.5 mm at the fin 2C side and the other with a width of 5 mm at the front wall 2Aa side. The distal end section 27a on the upstream side of the separation wall 27 is positioned in the boundary portion of the coolant introducing flow channel 21 and the introducing port section 21a.

By so forming the separation wall 27, it is possible to increase the flow velocity of the coolant flowing in from the introducing port 24 and also increase the flow rate of the coolant flowing in the fin 2C facing the distal end section 27A thereof. Therefore, the flow velocity of the coolant flowing toward the terminating end section inside the coolant introducing flow channel 21 is increased, and the cooling effect of the circuit element section 3D (see FIG. 6(A)) disposed at the position of the distal end section 27a of the separation wall 27 can be also increased.

Thus, the flow velocity of the coolant flowing inside the coolant introducing flow channel 21 toward the terminating end section thereof can be increased, and the cooling performance of the cooling device 2 can be adequately increased in response to the generation loss in the circuit element sections 3D to 3I, 3Iu, and 3Id disposed in the semiconductor module 10A shown in FIG. 6(A).

Figure 9:
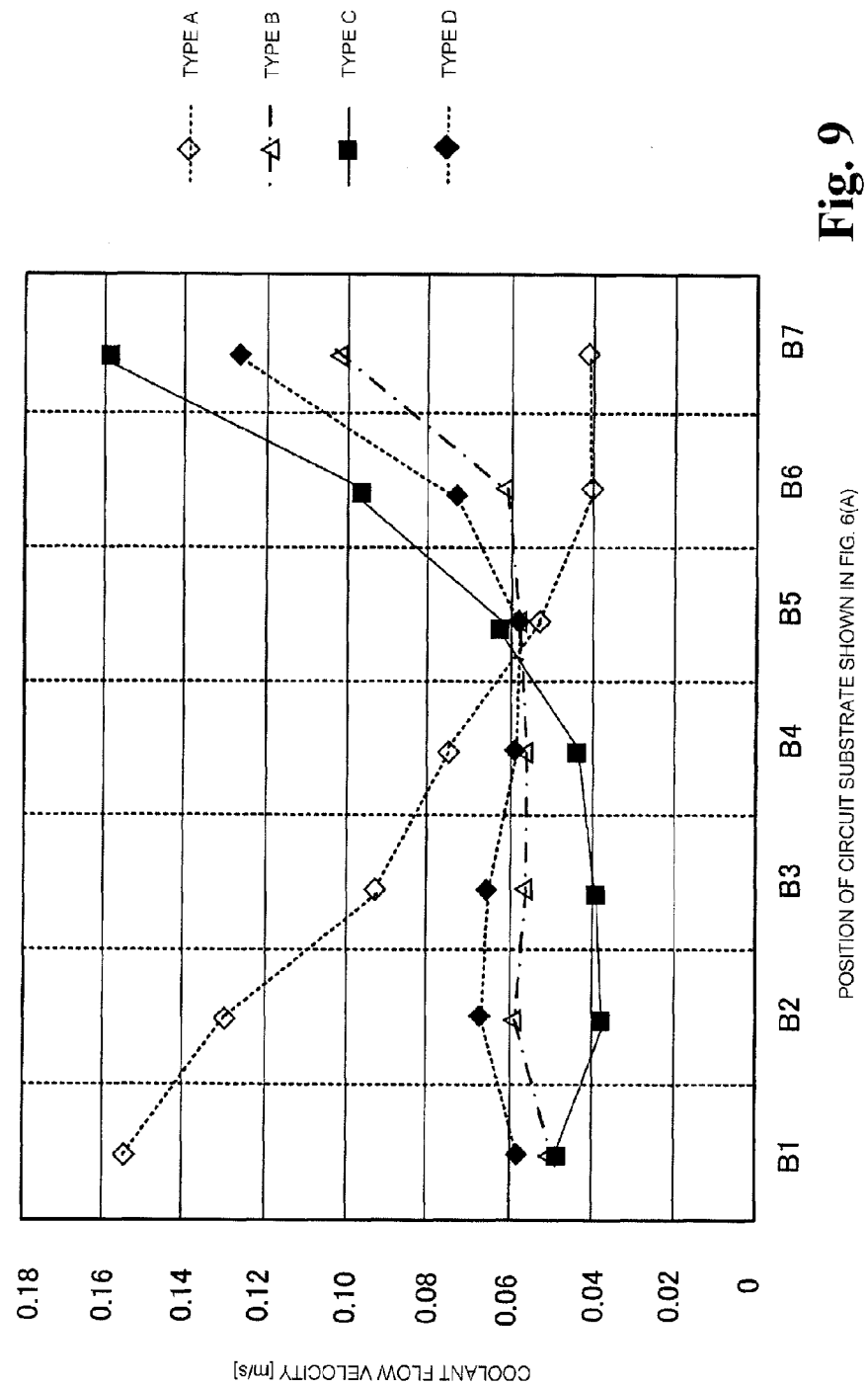
FIG. 9 shows, for each type, the coolant flow velocity distributions for each position of the circuit substrate, which are the cooling characteristics of the water jackets shown in FIGS. 6(B) to 8(A).
Figure 10:
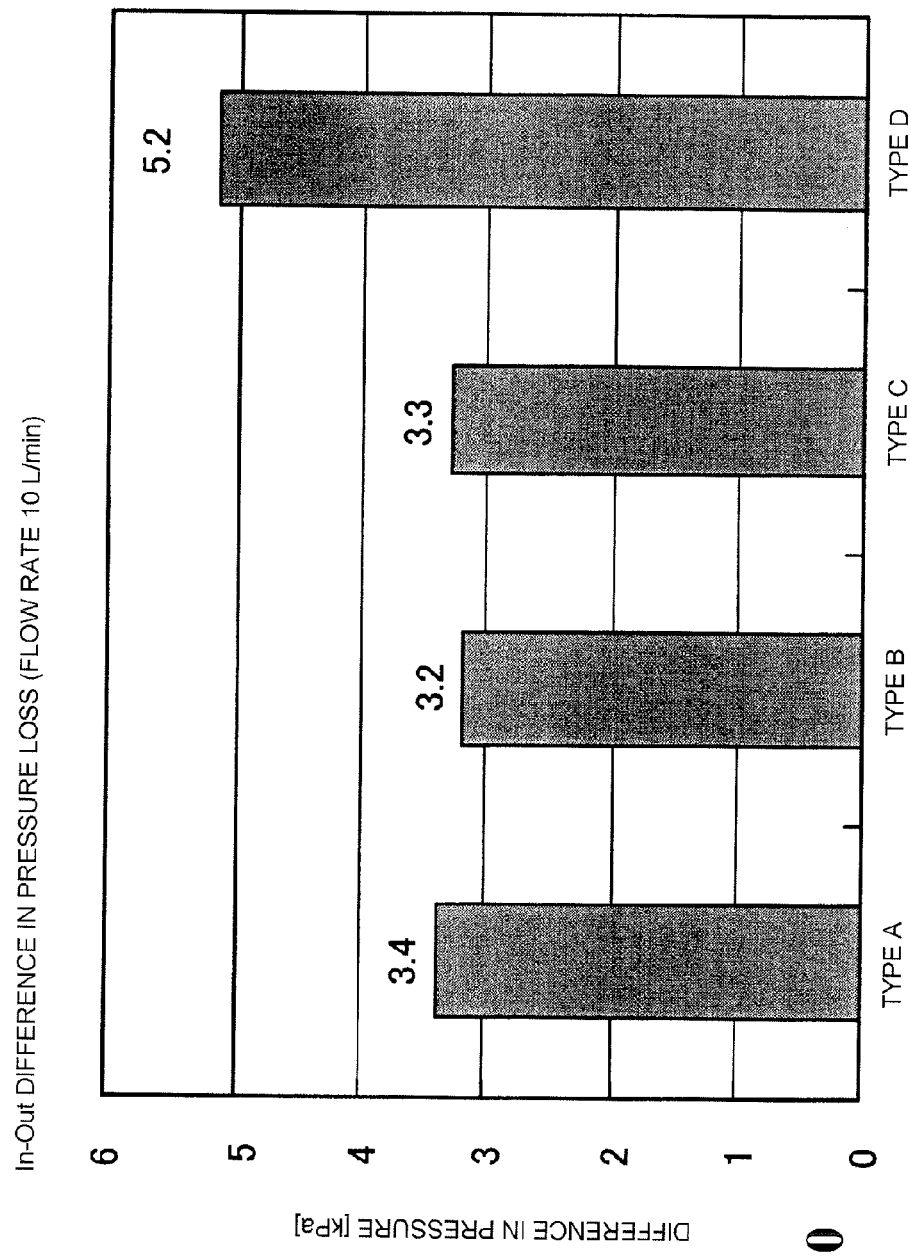
FIG. 10 shows, for each type, the difference in pressure loss between the inlet port and the discharge port that occurs when the coolant flows in the semiconductor modules shown in FIGS. 6(B) to 8(A).

FIG. 9 shows cooling characteristics of the water jackets shown in FIGS. 6(B) to 8(A). Thus, a coolant flow velocity distribution for each position of circuit substrate is shown for each type. FIG. 10 shows for each type the difference in pressure loss between the inlet port and discharge port that occurs when the coolant flows in the semiconductor modules shown in FIGS. 6(B) to 8(A).

In the graphs shown in FIG. 9, the flow velocity of the coolant flowing between the blade fins 2Ca is shown by way of example for each position (B1 to B7) of the circuit substrate with respect to the case in which the blade fins 2Ca shown in FIG. 4(A) are disposed inside the flow channel 23 for cooling and the coolant flows from the introducing port 24 at a flow rate of 10 L/min.

The graphs clearly show that the water jackets 2A of types (A to D) have a drift characteristic such that the flow velocity distribution of the coolant flowing to the circuit substrate positions B1 to B7 is uneven for each flow channel shape of the water jackets. For example, in the water jacket 2A of type A or type C in which the introducing port 24 and the discharge port 25 are both disposed at the same surface side, the flow velocity of the coolant at the B1 or B7 side to which a pipe is connected is high and equal to or higher than 0.15 m/s. Meanwhile, in the water jacket 2A of type B in which the introducing port 24 and the discharge port 25 are disposed at symmetrical positions, the coolant flow velocity is the highest (0.10 m/s) at the circuit substrate position B7 on the discharge port 25 side.

Thus, the coolant inside the flow channel 23 for cooling has a drift characteristic such that from among the parallel flow channels formed by the blade fins 2Ca between the coolant introducing flow channel 21 and the coolant discharge flow channel 22, the flow velocity is greatly increased at the discharge port 25 side. Further, it is clear that in type D which is obtained by modification of type A, the coolant flow velocity at the introducing port 24 side is also improved and also a flow velocity distribution (drift characteristic) similar to that of type B, in which the introducing port 24 and the discharge port 25 are disposed at symmetrical positions, can be formed.

Further, in the graph illustrating the difference in pressure loss in FIG. 10, in the water jackets 2A of types A to C prior to modification, practically the same difference in pressure loss is obtained (3.2 kPa to 3.4 kPa). By contrast, in the water jacket of type D in which the width of the coolant introducing flow channel 21 is reduced to ⅔ and the separation wall 27 is disposed therein, the difference in pressure loss is 5.2 kPa, that is, increased by 30% or more.

The arrangement of the circuit element sections 3D to 3I, 3Iu, and 3Id cooled by the cooling device 2 will be explained below.

As shown in FIG. 6(A) in the conventional semiconductor module 10A, in addition to 12 circuit element sections 3D to 3I arranged in 2 rows and 6 columns, two circuit element sections 3Iu, 3Id of different configurations can be disposed in the seventh column on the cooling device 2. In this case, a plurality of inverter circuits 40, for example, such as shown by way of example in FIG. 5, can be configured by combining, as appropriate, 12 circuit element sections 3D to 3I. Further, the circuit element sections 3Iu, 3Id can be configured, for example, as boosting converter circuits using the predetermined number of IGBT or FWD.

In this case, the circuit element sections 3Iu, 3Id configured for example as boosting converter circuits are connected to a battery and the inverter circuit 40, and the battery voltage is boosted by the circuit element sections 3Iu, 3Id. A circuit configuration can be used such that the boosted DC current is converted into an AC current by the inverter circuit 40 and supplied to the three-phase AC motor 41. In order to add newly such circuit element sections 3Iu, 3Id that differ in type from the circuit element sections 3D to 3I, the circuit element sections 3Iu, 3Id can be comparatively easily disposed at the end section of the semiconductor module 10A, as shown in FIG. 6(A), with consideration for wiring layout when the circuit is designed or manufactured.

In the semiconductor module 10A, two heat-generating sections are present inside the fins 2C along the circulation direction of the coolant flowing in the flow channel 23 for cooling of the cooling device 2. Thus, the two heat-generating sections are positioned separately on the upstream side and downstream side with respect to the flow direction of the coolant. As for the temperature of the coolant flowing on the downstream side, the coolant reaches the heat-generating section on the downstream side after the temperature thereof has already been raised by heat absorption in the heat-generating section on the upstream side. For this reason, the cooling efficiency of the circuit element section disposed on the upstream side is higher than that on the downstream side. Where such a difference in cooling efficiency is taken into account, the circuit element sections 3D to 3I can be cooled easier in the case where those circuit element sections thereamong that generate a large amount of heat during operation are disposed on the coolant introducing flow channel 21 side.

Further, the flow velocity distribution of the coolant flowing in the flow channel 23 for cooling of the cooling device has the above-described drift characteristic such that the coolant flow velocity increases at positions closer to the discharge port 25 than to the introducing port 24 of the flow channel. In addition, the efficiency of cooling performed by the fins 2C increases in the high-flow-velocity sections where the coolant flows with a high velocity in the flow channel 23 for cooling. Therefore, in the flow channel 23 for cooling of the semiconductor module 10A, the coolant is required to be circulated at a flow velocity equal to or higher than a certain level in response to the amount of heat generated by the circuit element sections 3D to 3I, 3Iu, and 3Id. However, where the flow rate of the coolant from the introducing port 24 is simply increased with the object of increasing the flow velocity in the low-flow-velocity sections, the amount of coolant flowing in the high-flow-velocity sections of the flow channel 23 for cooling becomes higher than necessary. As a result, the flow rate of the coolant supplied to the cooling device 2 should be increased and a high-performance pump should be used therefor.

Thermal fluid analysis including physical phenomena such as the flow, thermal conductivity, and heat transfer of the coolant is typically required for simulating the flow channel characteristics of the flow channel 23 for cooling in such semiconductor module 10A. Further, when the increase in temperature of the coolant by heat generation in the circuit element sections 3D to 3I, 3Iu, and 3Id is determined, the analysis results are obtained by providing a pressure loss generated in a stationary operation state.

Accordingly, where the flow velocity distribution of the coolant is simulated using the water jackets 2A of the conventional types A to C shown in FIG. 6(B) to FIG. 7(B), the coolant introduced from the introducing port 24 into the water jacket 2A flows so as to be dragged to the position of the discharged port 25. Therefore, the coolant flowing into the flow channel 23 for cooling becomes a comparatively fast flow, in particular at the side flow to the coolant discharge port 25, as shown in the coolant flow velocity distribution diagram in FIG. 9.

Further, in the plurality of disposed circuit element sections 3D to 3I, 3Iu, and 3Id, it is generally necessary to maintain the flow velocity of the coolant necessary for cooling the semiconductor elements 32, 33 according to the generated pressure loss. However, where the coolant flow velocity becomes significantly different due to the drift characteristic such as described hereinabove, the cooling performance thereof also assumes a similarly shifted distribution. Thus, in the flow channel 23 for cooling on the discharge port 25 side where the flow velocity increases, changes in cooling performance in response to flow velocity fluctuations are small, whereas at the introducing port 24 side where the flow velocity is easily reduced, those changes are large. It means that a flow velocity component appears that is unlikely to make a contribution to the increase in cooling performance on the discharge port 25 side.

Accordingly, where such a drift characteristic of the flow channel 23 for cooling could be improved and the coolant flow velocity which is as uniform as possible could be obtained, it would be possible not only to obtain more stable cooling performance, but also to improve the cooling performance of the entire cooling device 2 that cools the circuit element sections 3D to 3I, 3Iu, and 3Id.

The drift characteristic of the coolant is a phenomenon occurring in parallel flow channels inside the flow channel 23 for cooling that is interposed between the coolant introducing flow channel 21 and the coolant discharge flow channel 22. In particular, when the spacing of fins 2C for cooling that are disposed in the flow channel 23 for cooling is increased, the resistance offered to the coolant flowing from the coolant introducing flow channel 21 to the fins 2C is decreased and the coolant can easily flow into the flow channel for cooling. Therefore, the drift characteristic expands with a transition to a configuration with a wider spacing of the fins 2C of the flow channel 23 for cooling.

Since the drift characteristic differs, as mentioned hereinabove, among the types A to C shown in FIG. 6(B) to FIG. 7(B), a method for cooling uniformly and stably also differs according to the distribution of pressure loss inside the flow channel 23 for cooling, which differs among the circuit element sections 3D to 3I, 3Iu, and 3Id disposed in the fin base 2B.

In the below-described embodiments, a cooling device for a semiconductor module is explained in which the introducing port 24 and the discharge port 25 are disposed at the same surface side, similarly to the water jacket 2A of the conventional type A shown in FIG. 6(B), and which is modified so as to adjust the flow velocity distribution in the semiconductor module. The cooling effects demonstrated in the embodiments are based on the flow velocity distribution verified by the above-described simulation on the basis of the properties (coolant characteristics) and cooling performance of the coolant itself.

First Embodiment

Here, the cooling device 2 is explained in which a flow velocity adjusting plate 28 is disposed at the boundary position of the coolant discharge flow channel 22 and the flow channel 23 for cooling in order to adjust the drift in the semiconductor module.

Figure 11:
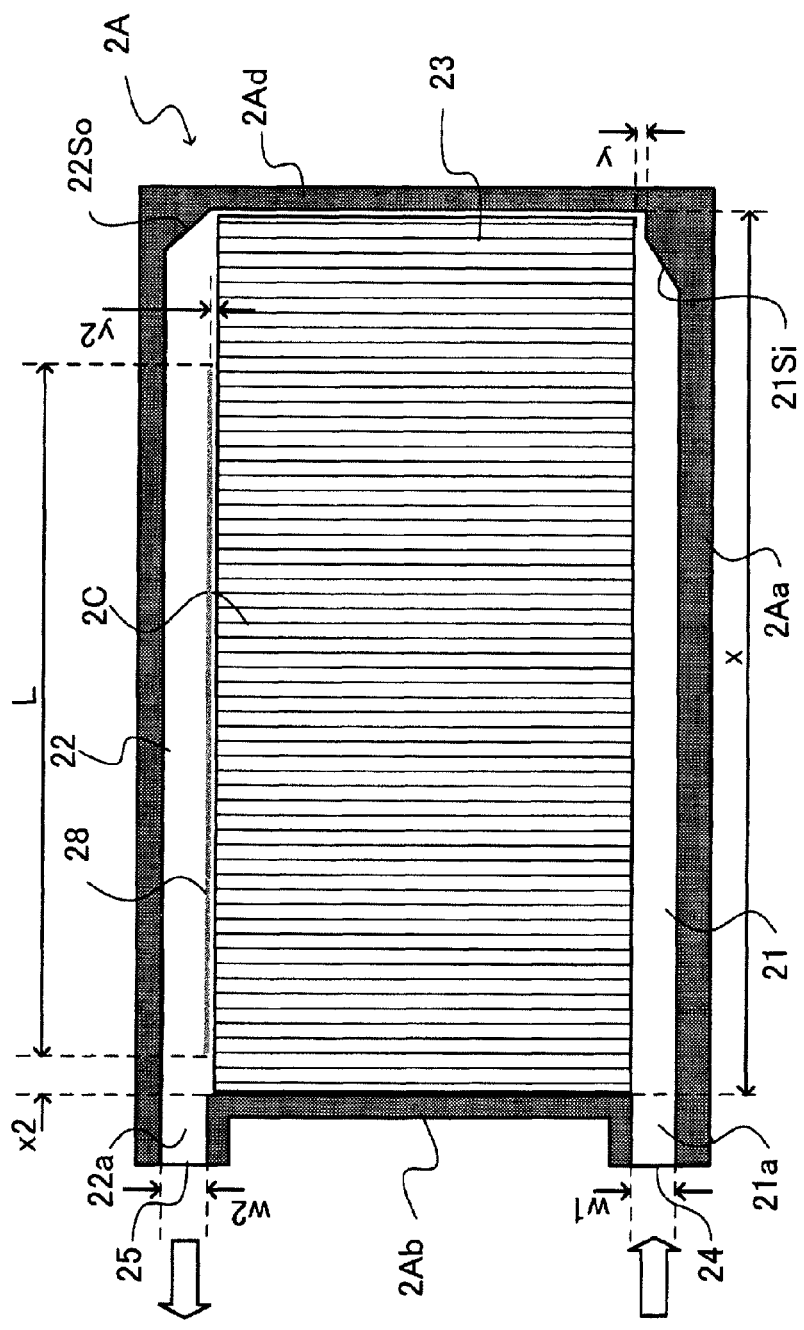
FIG. 11 is a plan view illustrating the shape of the water jacket used in the cooling device for a semiconductor module in accordance with the present invention.

FIG. 11 is a plan view illustrating the shape of the water jacket used in the cooling device for a semiconductor module in accordance with the present invention.

The water jacket 2A of type Fc shown in the figure is used as the cooling device 2 of the semiconductor module 10A shown in FIG. 6(A). Therefore, in the water jacket 2A of type Fc, the introducing port 24 and the discharge port 25 are disposed in the left wall 2Ab, in the same manner as in the water jacket of the conventional type A shown in FIG. 6(B). However, the introducing port section 21a that introduces the coolant from the introducing port 24 into the coolant introducing flow channel 21, and the discharge port section 22a for allowing the coolant to flow out of the coolant discharge flow channel 22 into the discharge port 25 are formed to be longer than those in the configuration shown in FIG. 6(B) or FIG. 3. Thus, the introducing port section 21a and the discharge port section 22a are formed such as to protrude from the same left wall 2Ab.

Further, in the water jacket 2A of type Fc, the introducing port section 21a and the discharge port section 22a are formed to have a width (W1=W2) equal to that of the introducing port 24 and the discharge port 25, respectively, for example, the same width of 15 mm. The length x of the coolant introducing flow channel 21 is 255.2 mm, and the guide section 21Si provided with a surface inclined at about 45° is formed in the terminating end portion of the coolant introducing flow channel at the inner surface side of the front wall 2Aa that faces the front side surface (coolant inflow surface) of the fins 2C disposed in the flow channel 23 for cooling. A gap y between the fins 2C and the guide section 21Si in the terminating end portion of the coolant introducing flow channel 21 is 2 mm, that is, the same as in the water jacket 2A (FIGS. 8(A), 8(B)) of type D.

In the water jacket 2A of type Fc, the flow velocity adjusting plate 28 is disposed at the boundary position of the coolant discharge flow channel 22 and the flow channel 23. The flow velocity adjusting plate 28 is formed to have a total length L (=215 mm), a height h (=9.5 mm) from the bottom surface of the water jacket 2A, and a width (thickness) of 3 mm. Further, the sidewall surface of the flow velocity adjusting plate 28 is positioned parallel to the rear side surface (coolant outflow surface) of the fins 2C, with a gap y2 (=2 mm) therebetween, and disposed such that one end section thereof forms a gap x2 (=5 mm) with the left wall 2Ab of the water jacket 2A.

Further, in the coolant discharge flow channel 22, the guide section 22So provided with a surface inclined at about 45° is disposed in the starting end section on the right wall 2Ad side, similarly to the guide section 21Si of the coolant introducing flow channel 21. In this configuration, by forming the sidewall surface of the flow velocity adjusting plate 28 parallel to the surface of the fins 2C, it is possible to reduce the ratio of the increase in pressure loss caused by the decrease in the flow channel cross-section area and also obtain an advantageous effect due to the increase in the flow channel width of the coolant discharge flow channel 22.

FIG. 12 is an explanatory drawing illustrating, for each type, the dimensions of the flow velocity adjusting plate in the cooling device for a semiconductor module shown in FIG. 11.

Here, in addition to the water jacket 2A of type Fc shown in FIG. 11, the water jackets 2A of type E, type Ea, type Eb, type F, type Fa, and type Fb are explained. The water jackets 2A of all types are formed to have the following dimensions: the flow channel widths (w1, w2) of the coolant introducing flow channel 21 and the coolant discharge flow channel 22 are each equal to 15 mm, the width of the flow channel 23 for cooling is 255 mm, the length thereof is 117 mm, the gap y between the guide section 21Si and the fins 2C is 2 mm, and the gap y2 between the flow velocity adjusting plate 28 and the fins 2C is 2 mm.

In the water jackets 2A of type E, type Ea, and type Eb, the length L and gap x2 are the same as in other types, that is, 175 mm and 0 mm, respectively, but the height h of the flow velocity adjusting plate 28 varies within a range from 9.5 mm to 5.5 mm. In the water jackets of types F, namely, types F, Fa, and Fb, the gap x2 is also 0 mm and the height h of the flow velocity adjusting plate 28 varies within a range from 9.5 mm to 5.5 mm, but the difference is that the length L thereof is 215 mm and longer than in the water jacket of type E. The difference between type Fc shown in FIG. 11 and all other types is that the gap x2 therein is 5 mm, rather than 0 mm.

Thus, by using the configuration that is based on the flow channel shape of the types shown in FIG. 12, with the length L of the flow velocity adjusting plate 28, the gap y2 with the fins 2C, and the gap x2 with the left wall 2Ab of the flow channel being changed, it is possible to suppress the flow velocity of the coolant toward the terminating end section inside the coolant introducing flow channel 21 to the appropriate degree. This feature will be described below with reference to FIGS. 13 and 14(A)-14(C).

The flow velocity distribution in the flow channel 23 for cooling is modified by the introducing port section 21a (see FIGS. 8(A), 8(B)) in which although the surface area of the introducing port 24 is the same, the cross-sectional area decreases continuously in the coolant introduction direction.

The results of simulation of coolant flow velocity and cooling effect performed with respect to the water jacket 2A having the flow channel shape of each type shown in FIG. 12 will be explained below. Here, a case is presumed in which the blade fins 2Ca with a thickness of 1.2 mm, a pitch of 2.1 mm, and a height of 10 mm are disposed in the flow channel 23 for cooling that is formed within a region with a width of 255 mm and a length of 117 mm, and the coolant is introduced at a flow rate of 10 L/min from the introducing port 24 into the coolant introducing flow channel 21. The simulation performed with respect to the water jackets 2A of different types confirmed the effect produced by the difference in length and positional relationship of the flow velocity adjusting plate 28 on the coolant flow velocity distribution.

Figure 13:
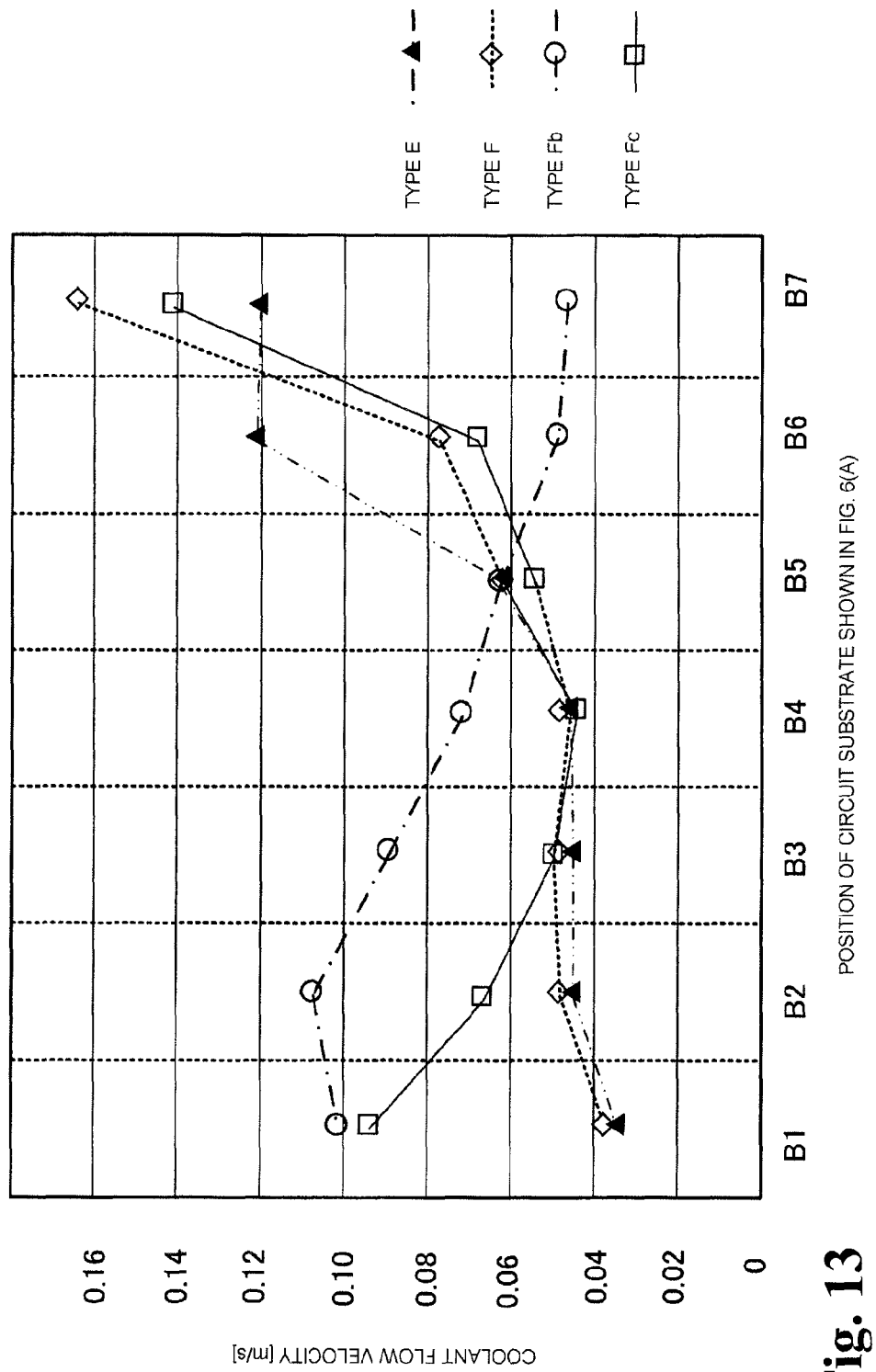
FIG. 13 shows, for each type, the coolant flow velocity distribution for each position of the circuit substrate, which is the cooling characteristic of the water jacket shown in FIG. 11.

FIG. 13 shows, for each type, the coolant flow velocity distribution for each position of the circuit substrate, which is the cooling characteristic of the water jacket shown in FIG. 11.

The flow velocity distribution shown in the figure is the result obtained by simulating the coolant flow velocity between the fins 2C disposed directly below the central section of the substrate of the circuit element sections 3D to 3I, 3Iu, and 3Id disposed in seven columns (positions B1 to B7). Here, the flow velocity is shown from the introducing port 24 side to the positions B1 to B7 toward the terminating end section of the coolant introducing flow channel 21. Further, the coolant introducing flow channels 21 used for the simulation of the flow channel distribution are all assumed to have a total length of 255 mm and a height of 10.5 mm.

According to the simulation results shown in FIG. 13, the flow velocity distribution changes significantly in the case of type E, type F, and type Fc in which the height of the flow velocity adjusting plate 28 is increased to 9.5 mm. Further, the type E and type F in which the height of the flow velocity adjusting plate 28 is 9.5 mm demonstrate the flow velocity distribution that depends on the length L thereof. Thus, in type E, the flow velocity increases at positions B6 and B7 of the circuit substrate, and in type F, the flow velocity at the position B7 rises especially significantly with respect to that in type Fb.

It follows from above that the flow velocity distribution can be adjusted because the flow velocity is reduced by the pressure generated when the coolant discharged from the fins 2C collides with the flow velocity adjusting plate 28. Further, when the gap x2 (=5 mm) is provided at the end section of the flow velocity adjusting plate 28 on the discharge port 25 side with respect to the left wall 2Ab of the water jacket 2A, the flow velocity distribution inside the fins 2C is converted to the U-like shape by the increase in the flow velocity of the coolant at the position B1. Thus, it is clear that any flow velocity distribution can be produced by using the flow velocity adjusting plate 28 inside the coolant discharge flow channel 22, and that even a very small gap of about 5 mm present in the vicinity of the discharge port 25 of the coolant discharge flow channel 22 greatly affects the flow velocity distribution.

Based on the above-described simulation results, it is possible to confirm the state of heat generation, that is, the cooling characteristic, in the power semiconductor element corresponding to the coolant flow velocity in the circuit element sections 3D to 3I, 3Iu, and 3Id with respect to the water jacket 2A of each type shown in FIG. 12.

Figure 14A:
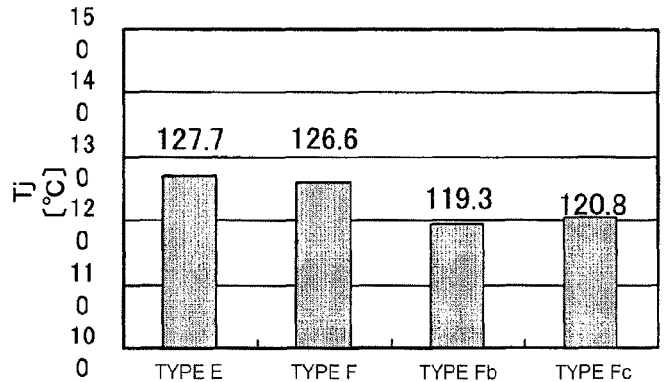
FIGS. 14(A)-14(C) show, for each type, the heat generation temperature during stationary operation for each circuit element section, which is the cooling characteristic of the water jacket shown in FIG. 11.
Figure 14B:
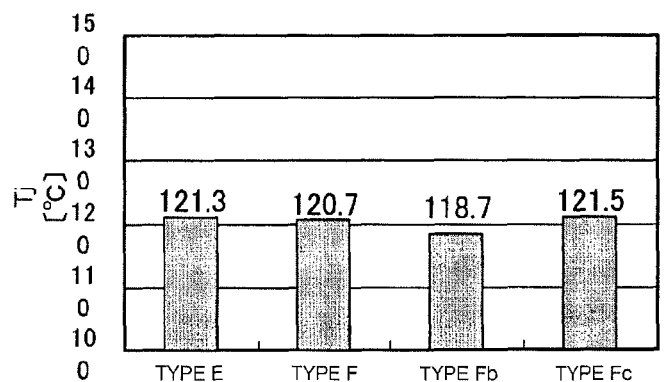
Figure 14C:
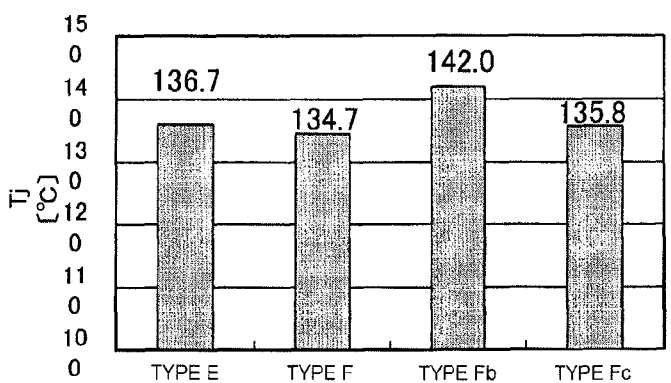

In FIGS. 14(A)-14(C), the heat generation temperature in each circuit element section during stationary operation, which is the cooling characteristic of the water jacket shown in FIG. 11, is shown for each type of water jackets. Those are all the examples of simulation results obtained by the above-described method.

The pressure loss received by the coolant inside the water jacket 2A when the circuit element section 3D is cooled differs among the types shown in FIG. 12. However, the heat loss inside the water jacket 2A is classified into two groups, each group including three rows from the introducing port 24 side, as shown in the above-described FIG. 6(A), that is, positions B1 to B3 of the circuit element sections 3D to 3F and the positions B4 to B6 of the circuit element sections 3G to 3I, and it is assumed that in the same group, the heat loss can be set to the same value. Further, in the circuit element sections 3Iu, 3Id of the seventh row, the heat loss is set to different values in the circuit element section 3Id on the upstream side and the circuit element section 3Iu on the downstream side.

The objects for comparison of heat generation temperature in FIGS. 14(A), 14(B) are the IGBT elements disposed on the downstream side of the circuit element section 3D of the first column (position B1) and the circuit element section 3G of the fourth row (position B4). Further, in the seventh column (position B7), the circuit element section (3Id) on the upstream side, which has a higher generation loss, from among the circuit element sections 3Iu and 3Id, is taken as a comparison object. With respect to the generation loss values that are set according to the heat generation amount of each of the circuit element sections 3D to 3I, 3Iu, and 3Id, the relationship 3D<3G<3Iu<3Id is set on the basis of the relationship between the coolant flow velocity, coolant temperature, and cooling performance.

As shown in FIG. 14(C), the junction temperature (Tj) of the circuit element section 3Id is 136.7° C. in type E, 134.7° C. in type F, and 142.0° C. in type Fb in which the flow velocity distribution shifted to the discharge port 25 side. In this case, the length of the flow velocity adjusting plate 28 ensures a temperature reduction effect equal to or greater than 5° C. Further, as shown in FIGS. 14(A), 14(B), in other circuit element sections 3D and 3G, the junction temperature of each IGBT changes following the changes in the flow velocity distribution downstream of the B1 column and downstream of the B4 column. However, where the length of the flow velocity adjusting plate 28 is adjusted such as to obtain the flow velocity distribution corresponding to the generation loss in the circuit element sections 3D to 3I, 3Iu, and 3Id, stable cooling performance can be obtained in each of the columns (B1 to B7) in the longitudinal direction of the cooling device 2.

Thus, in the water jacket 2A used in the semiconductor module in accordance with the present invention, by disposing the flow velocity adjusting plate 28 at a boundary position of the coolant discharge flow channel 22 and the flow channel 23 for cooling, it is possible to reduce the junction temperature of the power semiconductor element. A particularly significant effect is demonstrated in increasing the flow velocity immediately below the central section of the substrate (position B7) of the circuit element section 3Id with a high generation loss.

Figure 15:
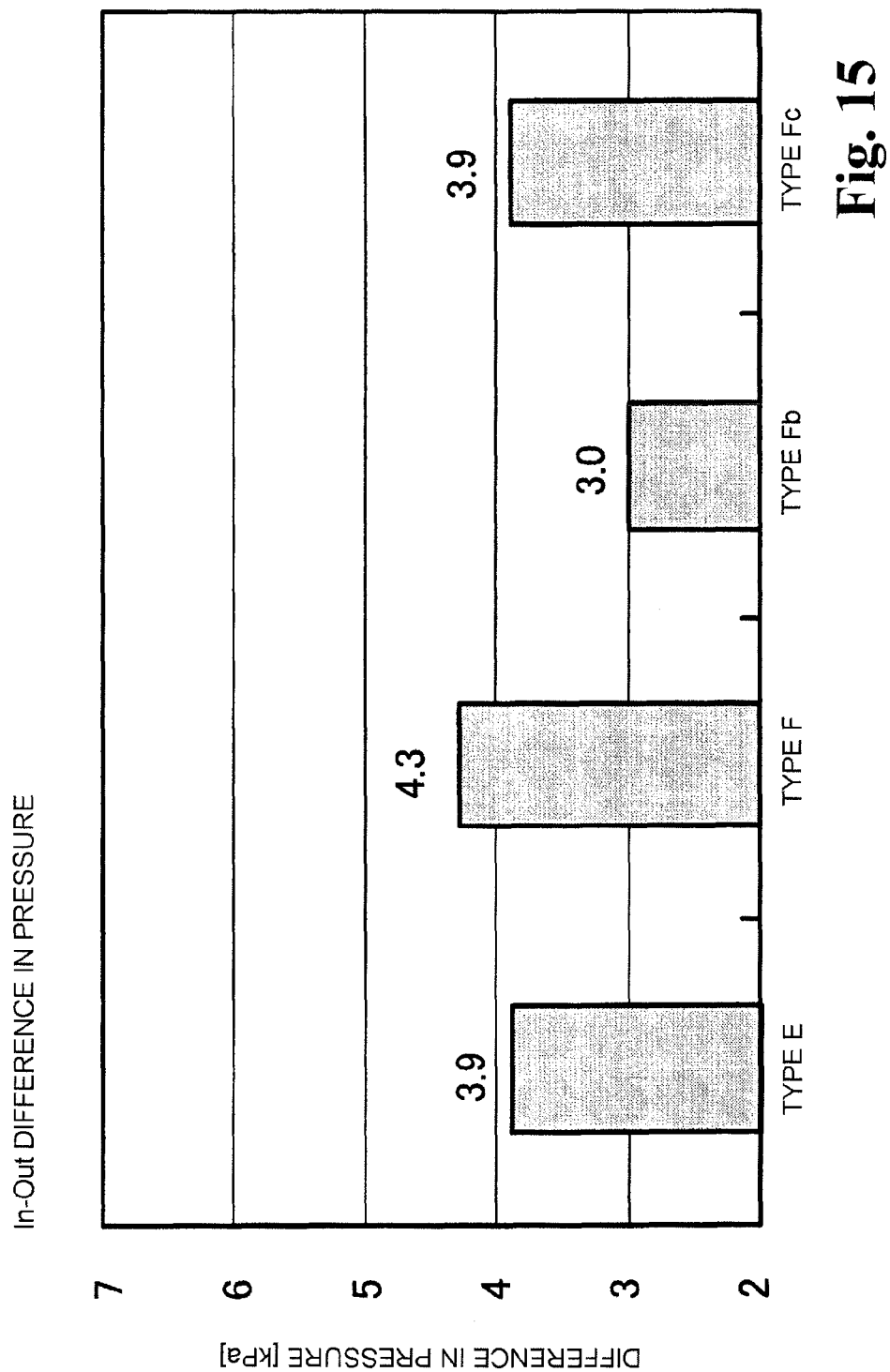
FIG. 15 shows, for each type, the difference in pressure loss between the introducing port and the discharge port when the coolant flows in the semiconductor module shown in FIG. 11.

FIG. 15 shows, for each type, the difference in pressure loss between the introducing port and the discharge port when the coolant flows in the semiconductor module shown in FIG. 11. According to the simulation results shown in FIG. 15, a value less than 4.5 kPa is obtained for all types. Thus, the pressure loss is decreased in comparison with that of the modification example (type D) on the coolant introducing flow channel 21 side, as in the fourth comparative example shown in FIGS. 8(A), 8(B), and the flow velocity distributions practically match each other. By so disposing the flow velocity adjusting plate 28 that performs flow velocity adjustment on the coolant discharge flow channel 22 side, it is possible to decrease the pressure loss and also reduce the load on the pump.

In the water jacket 2A of the present embodiment, the coolant introducing flow channel 21 is defined by the inner surface of the bottom wall 2Ae of the water jacket and the front side surface of the fins 2C constituting the heat sink, and the coolant discharge flow channel 22 is defined by the inner surface of the bottom wall 2Ae and the rear side surface of the fins 2C. Further, the flow velocity of the coolant flowing from the coolant introducing flow channel 21 to the fins 2C is adjusted, as appropriate, by the pressure generated by collision of the coolant flowing out of the fins 2C with the flow velocity adjusting plate 28 disposed in the coolant discharge flow channel 22, and the drift appearing in the coolant flow velocity in the fins 2C can be eliminated. As a result, the semiconductor element disposed on the cooling device 2 can be cooled uniformly and stably, and malfunction or fracture caused by heat generation in the semiconductor element can be reliably prevented.

Further, in the configuration of the first embodiment, the introducing port 24 and the discharge port 25 are disposed in the same surface of the water jacket 2A, and the flow channel shape can be configured such as to obtain the cooling performance corresponding to generation loss in the different circuit element sections 3D to 31, 3Iu, and 3ID. In particular, the water jacket 2A with a smaller length from the introducing port 24 to the discharge port 25 can be manufactured easily and stably.

Further, an even better flow velocity adjustment effect can be demonstrated by using the conventional width adjustment of the coolant introducing flow channel 21 and the separation wall 27 such as shown in FIGS. 8(A), 8(B) in combination with the flow velocity adjusting plate 28 disposed in the coolant discharge flow channel 22.

In the fins 2C constituting the heat sink, the front side surfaces are substantially parallel to the inflow direction of the coolant flowing in from the introducing port 24, and the fins are installed at positions flush with the inner wall of the introducing port section 21a, so as not to block the flow of the coolant in the coolant introducing flow channel 21. Further, the fin base 2B is at a constant distance from the bottom wall 2Ae of the water jacket 2A, this distance determining the height of the coolant introducing flow channel 21.

Second Embodiment

Figure 16:
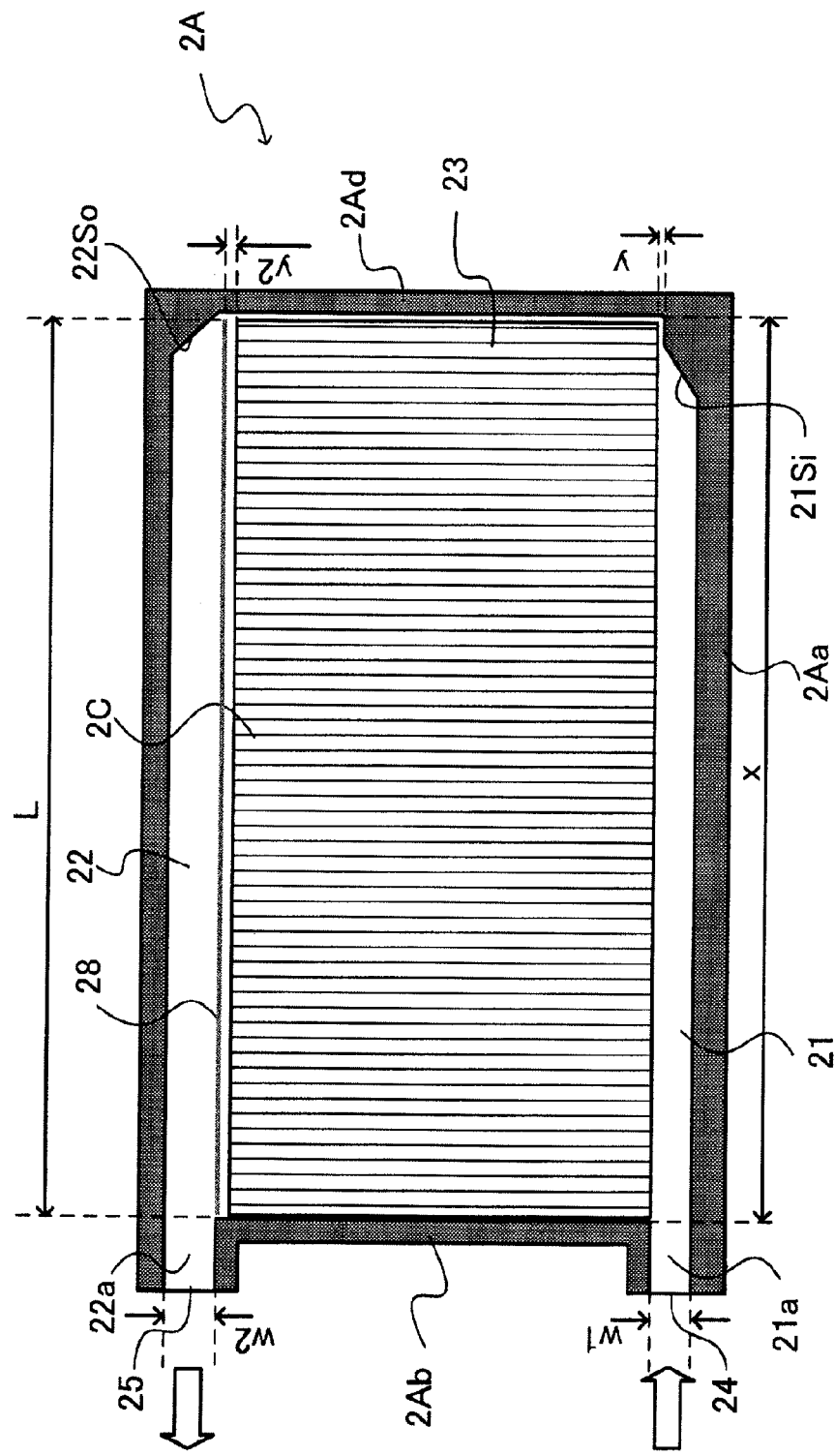
FIG. 16 is a plan view illustrating the shape of the water jacket used in another cooling device for a semiconductor module in accordance with the present invention.

FIG. 16 is a plan view illustrating the shape of the water jacket used in another cooling device for a semiconductor module in accordance with the present invention.

In this embodiment, a cooling device is explained in which the flow velocity adjusting plate 28 is disposed inside the coolant discharge flow channel 22 and also the length of the flow velocity adjusting plate is made equal to that of the coolant discharge flow channel 22, thereby adjusting the drift in the semiconductor module and cooling the semiconductor element uniformly and stably.

In the water jacket 2A of type G shown in FIG. 16, similarly to the type D shown in FIGS. 8(A), 8(B) or type Fc shown in FIG. 11, the introducing port section 21a that guides the coolant from the introducing port 24 into the coolant introducing flow channel 21, and the discharge port section 22a for allowing the coolant to flow out from the coolant discharge flow channel 22 into the discharge port 25 are formed to protrude from the same left wall 2Ab of the water jacket 2A. Further, in the water jacket 2A of type G, not only the introducing port 24 and the discharge port 25 of the cooling device are formed at the same surface side, but also the flow velocity adjusting plate 28 with a length equal to the length x of the coolant discharge flow channel 22 is disposed at a boundary position of the coolant discharge flow channel 22 and the flow channel 23 for cooling.

FIG. 17 is an explanatory drawing showing, for each type, the dimensions of the flow velocity adjusting plate and the flow channel width in the introducing port and discharge port in the cooling device for a semiconductor module shown in FIG. 16. As shown in FIG. 17, inside the coolant discharge flow channel 22 of type G, the flow velocity adjusting plate 28 is formed at any height not exceeding 8 mm in the vertical direction from the surface of the bottom wall 2Ae of the water jacket 2A. Further, the flow channel 23 for cooling is configured between the coolant introducing flow channel 21 with a width of 10 mm and the coolant discharge flow channel 22 with a width of 15 mm. In addition to type G, this figure shows also the dimensions relating to type Ga, type Gb, type Gc, type H, and type I.

As mentioned hereinabove, the flow velocity of the coolant flowing in the flow channel 23 for cooling has a flow velocity distribution depending on the position of the discharge port 25 of the water jacket 2A. In this case, the flow velocity adjusting plate 28 with a length L=255 mm and a width (thickness) of 3 mm is additionally formed inside the coolant discharge flow channel 22 (that is, the gap x2 with the left wall 2Ab of the water jacket 2A is 0 mm), the uniformity of the flow velocity of the coolant discharged from the fins 2C is improved and a constant flow velocity distribution is obtained.

Thus, the water jacket 2A of type G is different from the water jackets of type E and type F shown in FIG. 12 in that the length of the flow velocity adjusting plate 28 is made equal to the length x of the coolant discharge flow channel 22 (that is, the width of the flow channel 23 for cooling), and the flow velocity adjusting plate 28 is connected to the left wall 2Ab (sidewall of the flow channel 23 for cooling on the discharge port 25 side) of the water jacket 2A.

Figure 18A:
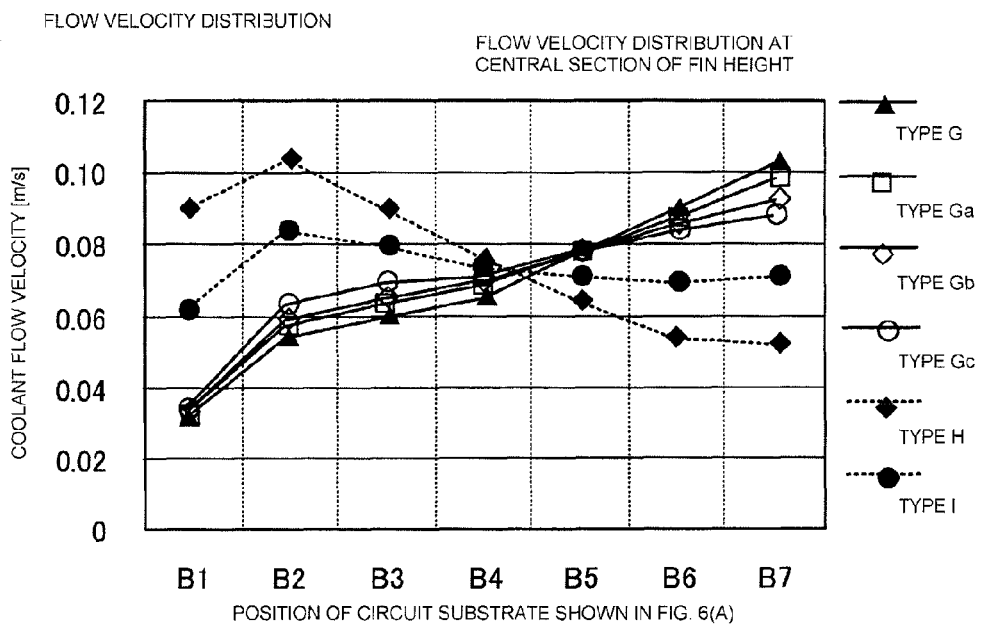
FIG. 18(A) shows, for each type, the coolant flow velocity distribution at each position of the circuit substrate, which is the cooling characteristic of the water jacket shown in FIG. 16.
Figure 18B:
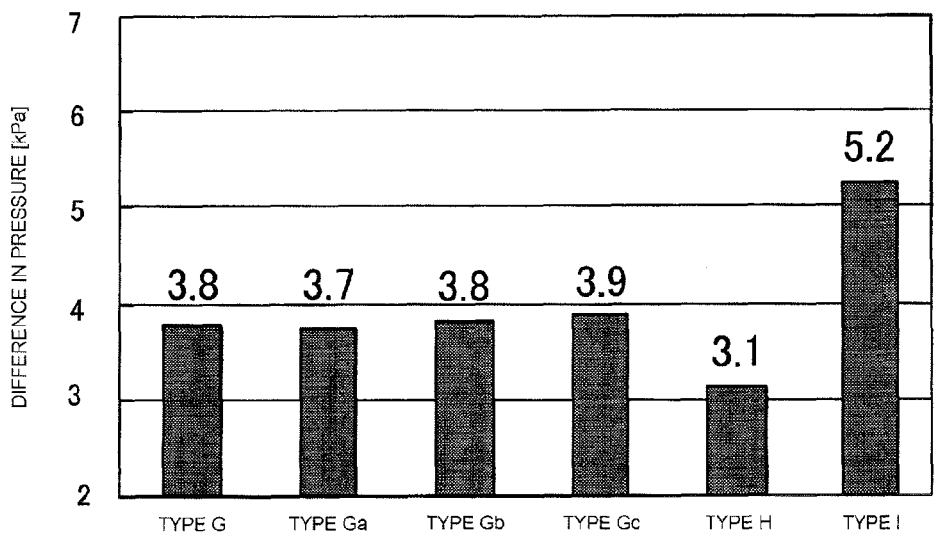
FIG. 18(B) shows, for each type, the difference in pressure loss between the introducing port and the discharge port.

FIG. 18(A) shows, for each type, the coolant flow velocity distribution at each position of the circuit substrate, which is the cooling characteristic of the water jacket shown in FIG. 16, and FIG. 18(B) shows, for each type, the difference in pressure loss between the introducing port and the discharge port.

The flow velocity distribution shown in FIG. 18(A) is obtained by simulation immediately below the central section of the substrate of the circuit element sections 3D to 3I, 3Iu, and 3Id disposed at the circuit substrate positions B1 to B7 shown in FIG. 6(A), and the coolant flow velocity distribution is compared among the types for each position B1 to B7. The difference in pressure loss is the difference in pressure between the introducing port 24 and the discharge port 25.

In this case, the simulation results are shown that relate to type G, type Ga, type Gb, type Gc, type H, and type I. It is clear that in types G, Ga, Gb, Gc in which the flow velocity adjusting plate 28 is disposed at different heights h of 2 mm, 4 mm, 6 mm, and 8 mm, respectively, in the coolant introducing flow channel 21 with a flow channel width W1 of 10 mm, the coolant flow velocity is particularly reduced at the circuit substrate position B7, thereby enabling the adjustment to a uniform flow velocity distribution. Further, according to the simulation results relating to types G to Gc, type H, and type I that differ in the flow channel width W1 of the coolant introducing flow channel 21 as 10 mm, 15 mm, and 12.5 mm, respectively, the difference between the highest flow velocity and the lowest flow velocity is the smallest when the difference between the flow channel width W1 of the coolant introducing flow channel 21 and the flow channel width W2 of the coolant discharge flow channel 22 is 2.5 mm (type I). In type H in which the flow channel widths are W1=W2 (=15 mm), the flow velocities at the circuit substrate positions B1 and B7 are reversed. Thus, in the water jacket 2A of type I in which the flow channel width W1 of the coolant introducing flow channel 21 is 12.5 mm, the best uniformity of the flow velocity distribution is realized.

In type H in which the widths W1, W2 of the introducing port 24 and the discharge port 25, respectively, are each 15 mm, by making the height h of the flow velocity adjusting plate 28 equal to 8 mm, it is possible to increase the lowest value of the coolant flow velocity to 0.05 m/s by comparison with the lowest value (=0.04 m/s) of the conventional type A in which the flow velocity adjusting plate 28 is not provided. For this reason, the uniformity of flow velocity distribution in the flow channel 23 for cooling is improved, and flow velocity adjustment can be performed correspondingly to the generation loss in each circuit. Meanwhile, according to the pressure loss shown in FIG. 18(B), in the water jacket 2A of type I, the difference in pressure is 5.2 kPa, and the variation of pressure loss depends on the width W1 of the coolant introducing flow channel 21. This result indicates that the uniformity of coolant flow velocity distribution is in a trade-off relationship with the difference in pressure loss.

Concerning the gap y2 between the fins 2C and the flow velocity adjusting plate 28 (this gap is 2 mm for all types), the reduction in size thereof increases the effectiveness of adjusting to a uniform flow velocity distribution, but also results in the increased pressure loss inside the water jacket 2A. However, since the maximum difference in pressure is equal to or less than 6 kPa for any of types G to Gc, type H, and type I, this result is within the range of difference in pressure loss equal to or less than 10 kPa that is supposed for the water jacket 2A, and in terms of enabling a sufficient coolant flow rate, no obstacles are created even with the conventional pump performance.

Thus, with the water jacket 2A of the present embodiment, in the configuration in which the introducing port 24 and the discharge port 25 of the cooling device are formed at the same surface side and, at the same time, the flow velocity adjusting plate 28 is disposed at a boundary position of the coolant discharge flow channel 22 and the flow channel 23 for cooling, the uniformity of drift distribution can be improved by making the length of the flow velocity adjusting plate 28 equal to that of the coolant discharge flow channel 22 and reducing to a certain degree the flow channel width w1 of the coolant introducing flow channel 21. Therefore, in the second embodiment, by improving the uniformity of drift distribution of coolant flow velocity in the water jacket 2A, it is possible to obtain the flow velocity distribution with good cooling efficiency even when the thermal loss in the circuit element sections on the upstream side and the circuit element sections on the downstream side is substantially constant.

Described below is an embodiment in which a plurality of guide sections is provided in the coolant introducing flow channel and the adjustment of flow velocity distribution in the flow channels for cooling constituted by a plurality of rows is performed more effectively.

Figure 19:
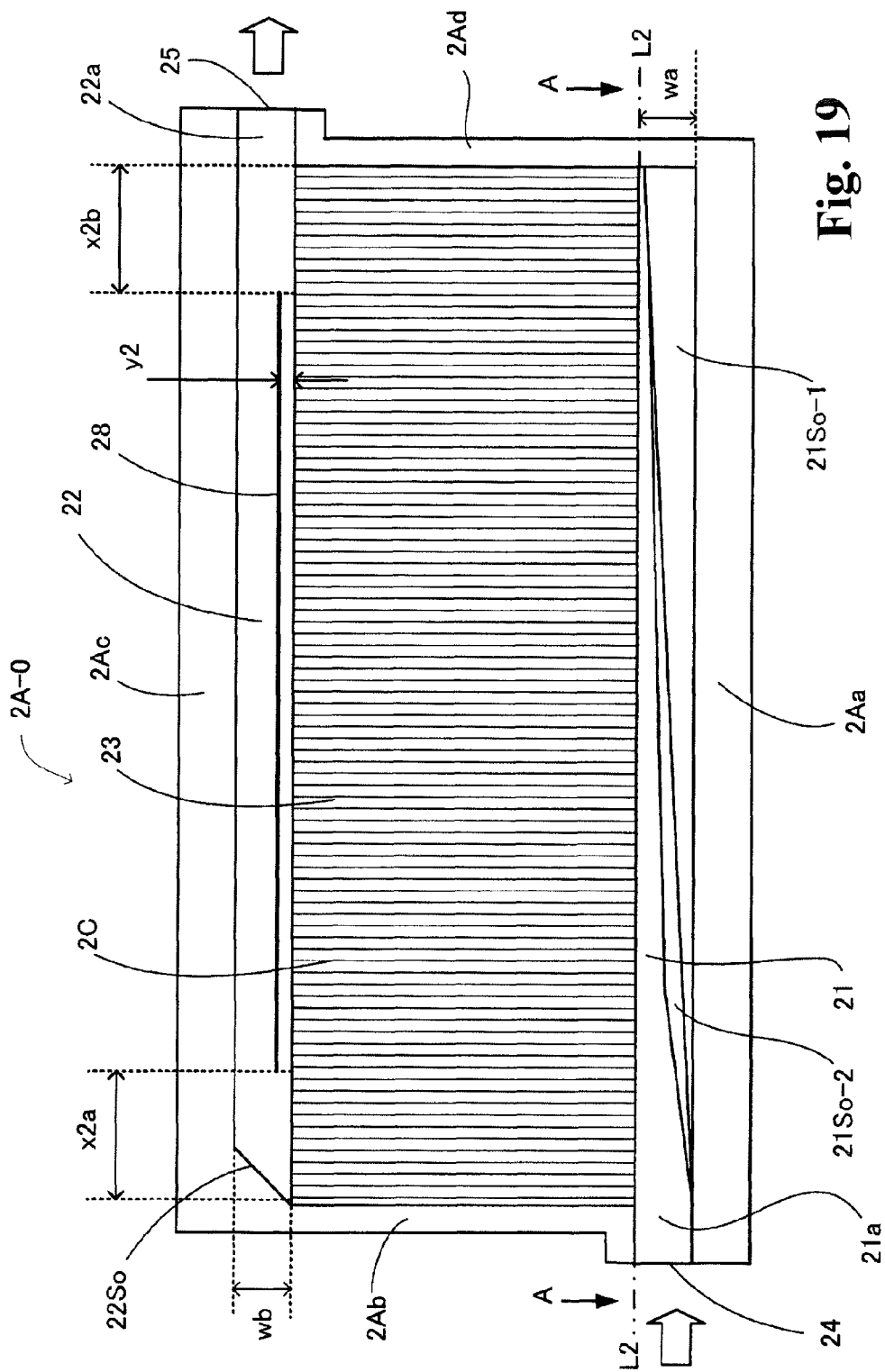
FIG. 19 illustrates a configuration example of a water jacket for use in the cooling device for a semiconductor module.

FIG. 19 illustrates a configuration example of a water jacket for use in a cooling device for a semiconductor module. The water jacket 2A-0 for use in a cooling device for a semiconductor module has a substantially rectangular parallelepiped shape.

The water jacket 2A-0 is provided with a coolant introducing flow channel 21, an introducing port section 21a, a coolant discharge flow channel 22, a discharge port section 22a, and a flow channel 23 for cooling that has the fins 2C disposed therein. Those coolant introducing flow channel 21 and the like are defined by a front wall 2Aa, a left wall 2Ab, a rear wall 2Ac, a right wall 2Ad, and the water jacket 2A-0. The fins 2C are depicted in the drawing for the sake of convenience of explanation.

Meanwhile, an introducing port 24 for introducing the coolant into the water jacket and a discharge port 25 for discharging the coolant therefrom are arranged such that the discharge port 25 is formed at a position diagonally opposite the introducing port 24 in the water jacket 2A-0. For example, in the configuration shown in FIG. 19, the introducing port 24 is provided in the lower section of the left wall 2Ab of the water jacket 2A-0, and the discharge port 25 is provided in the upper section of the right wall 2Ad (a configuration may be also used in which the introducing port 24 is provided in the upper section of the left wall 2Ab, and the discharge port 25 is provided in the lower section of the right wall 2Ad). The coolant introduction direction in the introducing port 24 and the coolant discharge direction in the discharge port 25 are oriented in the same direction.

A flow velocity adjusting plate 28 is provided in a substantially central section of the coolant discharge flow channel 22 at a boundary position of the coolant discharge flow channel 22 and the flow channel 23 for cooling. The flow velocity adjusting plate 28 is disposed such that the sidewall surface thereof is parallel to the coolant outflow surface of the fins 2C, with a gap y2 being formed therebetween, a gap x2a is formed between one end of the flow velocity adjusting plate and the side surface of the left wall 2Ab, and a gap x2b is formed between the other end of the flow velocity adjusting plate and the side surface of the right wall 2Ad.

Further, the starting end section of the coolant discharge flow channel 22 through which the coolant flows out to the discharge port 25 is chamfered to form a guide section 22So having an inclination angle of about 45°. Guide sections 21So-1, 21So-2 are additionally provided inside the coolant introducing flow channel 21.

Figure 20:
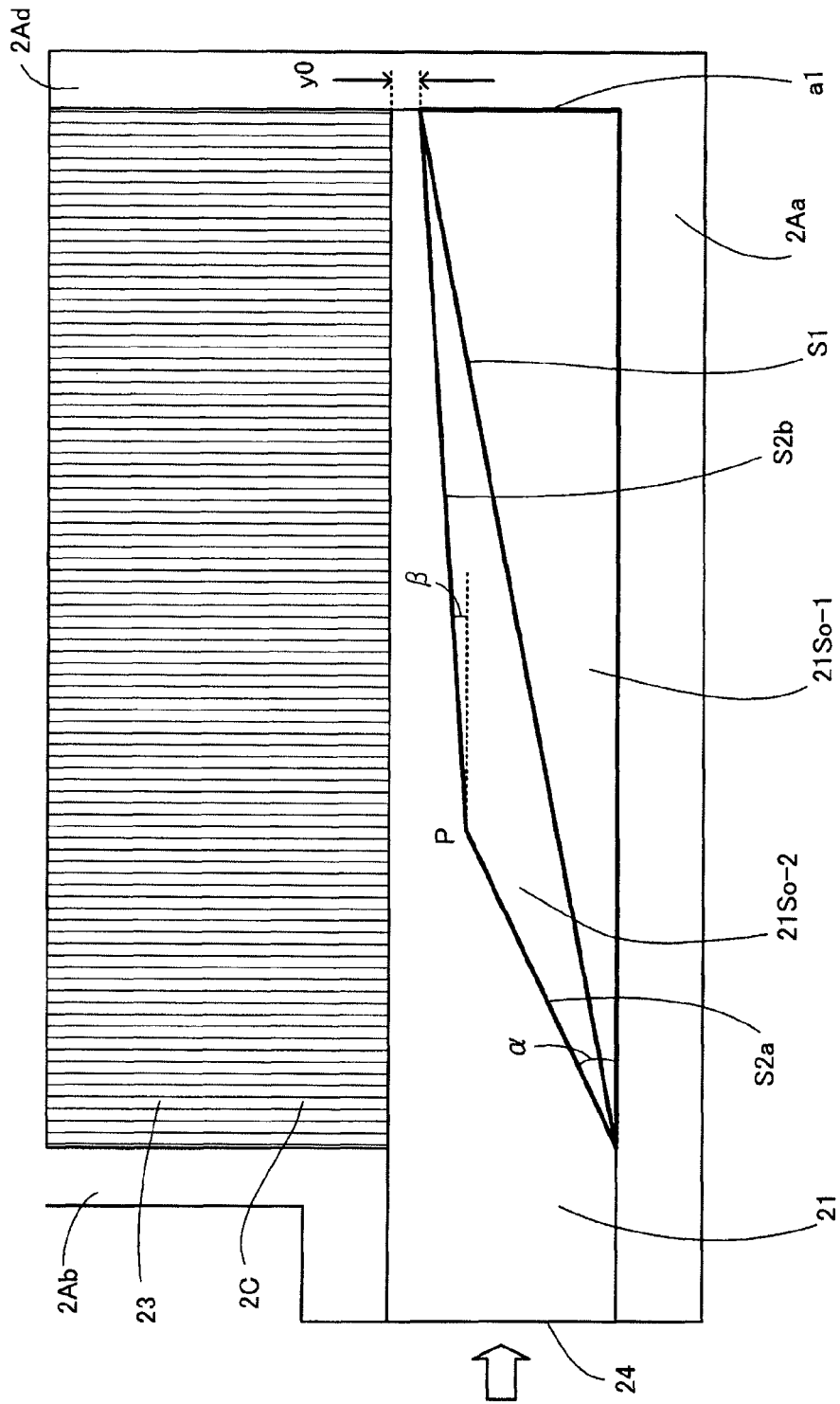
FIG. 20 shows a configuration example of the guide section.

FIG. 20 shows a configuration example of the guide sections. This figure is an enlarged view of the guide sections 21So-1 and 21So-2 configured as shown in FIG. 19 and the surroundings thereof. The guide section 21So-1 has a guide wall S1 on the surface facing the flow channel 23 for cooling, and the surface on the side opposite that of the guide wall S1 is contacting the front wall 2Aa.

The guide wall S1 of the guide section 21So-1 is inclined such that the introducing flow channel cross-section area of the coolant introducing flow channel 21 decreases from the introducing port 24 toward an abutment wall a1 inside the coolant introducing flow channel 21.

Meanwhile, the guide section 21So-2 has guide walls S2a, S2b on the surface facing the flow channel 23 for cooling, and the surface of this guide section on the side opposite to those of the guide walls S2a, S2b contacts the guide wall S1 of the guide section 21So-1. The guide walls S2a, S2b of the guide section 21So-2 are formed with an inflection point P as a boundary.

The guide wall S2a is inclined such that the introducing flow channel cross-section area of the coolant introducing flow channel 21 decreases from the introducing port toward the inflection point P. The guide wall S2b is inclined such that the introducing flow channel cross-section area of the coolant introducing flow channel 21 decreases from the inflection point P toward the abutment wall a1 inside the coolant introducing flow channel 21.

An angle between a straight line in the longitudinal direction of the coolant introducing flow channel 21 and the guide wall S2a is taken as an inclination angle $\alpha$, and an angle between a straight line in the longitudinal direction of the coolant introducing flow channel 21 and the guide wall S2b is taken as an inclination angle $\beta$.

In this configuration, $\beta<\alpha$, that is, the inclination angle $\alpha$ of the guide wall S2a is larger than the inclination angle $\beta$ of the guide wall S2b. The fins 2C and the guide wall S2b form a gap (minimum value) y0 at the abutment wall a1.

Figure 21:
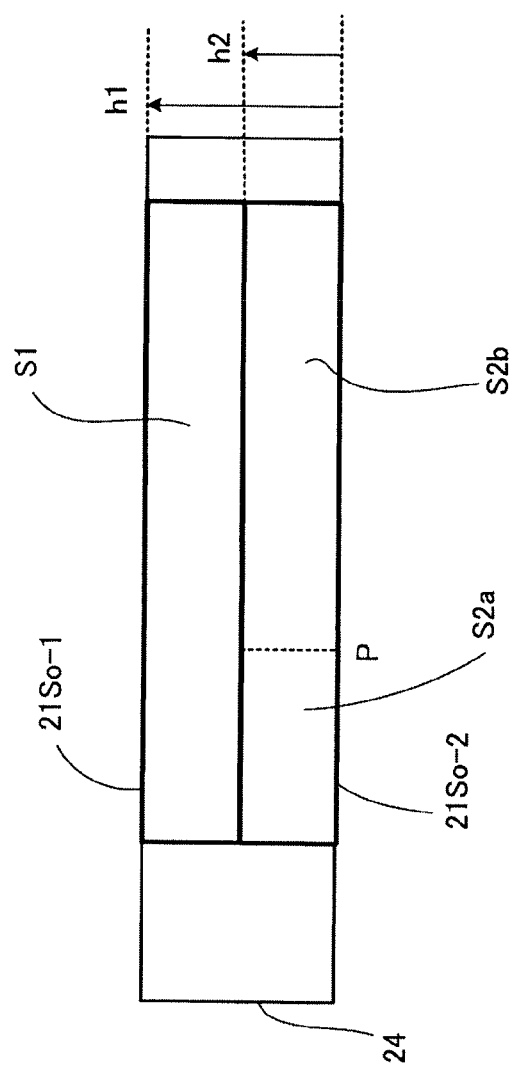
FIG. 21 is a cross-sectional view taken along the line L2-L2.

FIG. 21 is a cross-sectional view taken along the line L2-L2. In this figure, the cross section taken along the line L2-L2 shown in FIG. 19 is viewed from the direction of arrow A. In this configuration, the height of the guide section 21So-1 above the bottom surface of the coolant introducing flow channel 21, that is, the height of the guide wall S1, is taken as h1.

The height of the guide section 21So-2, which is positioned in front of the guide section 21So-1, above the bottom surface of the coolant introducing flow channel 21, that is, the height of the guide walls S2a, S2b, is taken as h2. In this case, the relationship h2<h1 is satisfied.

For example, the heights h1, h2 can be such that the height h2 of the guide walls S2a, S2b is taken as about half of the length of the fins 2C from the bottom surface of the coolant introducing flow channel 21, and the height h1 of the guide wall S1 is taken as a length from the bottom surface of the coolant introducing flow channel 21 to the mounting surface of the fins 2C of the base material 26 (FIG. 2).

Described above is the configuration in which the guide sections 21So-1, 21So-2 are provided as two guide sections inside the coolant introducing flow channel 21, and the guide section 21So-1 is higher than the guide section 21So-2.

Where such a configuration is generalized to a case in which a plurality of guide sections (three or more guide sections) is provided inside the coolant introducing flow channel 21, the side surface (corresponds to the guide wall S1) of the guide section (corresponds to the guide section 21So-1) contacting the front wall 2Aa of the water jacket 2A-0 is made the highest among the plurality of guide sections. The height of the side surface of the guide sections is decreased with the transition from the guide section contacting the front wall 2Aa to the guide section at a position that is closer to the flow channel 23 for cooling.

Thus, the height of the guide wall of the guide section contacting the front wall 2Aa of the water jacket 2A-0 inside the coolant introducing flow channel 21 is made the largest, the height of the guide wall is set lower for a guide section disposed farther from the front wall 2Aa and closer to the flow channel 23 for cooling, and the height of the plurality of guide sections inside the coolant introducing flow channel 21 is formed in a stepwise manner.

By using such a shape in which the height of each guide wall of the plurality of guide sections is decreased in a stepwise manner with the transition from the front wall 2Aa to the flow channel 23 for cooling, it is possible to adjust the flow velocity distribution of the flow channel 23 effectively and in a simple manner.

Here, the case is considered in which the introducing port 24 for introducing the coolant into the water jacket and the discharge port 25 for discharging the coolant to the outside are provided at mutually symmetrical positions in the water jacket 2A-0, and the guide sections 21So-1, 21So-2 are not present.

The specific feature of such a configuration of the water jacket is that the coolant flows easier at the discharge port 25 side, and therefore in the flow velocity distribution of the coolant inside the flow channel 23 for cooling, the flow velocity becomes lower at the introducing port 24 side and becomes intensively higher at the discharge port 25 side.

Meanwhile, by providing such a configuration with the guide section 21So-1, it is possible to intensify the coolant flow at the introducing port 24 side. Therefore, the phenomenon of the coolant flow velocity distribution inside the flow channel 23 becoming intensively higher at the discharge port 25 side can be suppressed. Where the guide section 21So-2 is additionally provided, the coolant flow at the introducing port 24 side can be further increased.

Therefore, where the heat generation distribution of the circuit elements mounted on the base material 26 is taken into account, in the case in which the circuit element sections with a high loss density and high heat generation ability are mounted on the circumferential portion of the introducing port 24 and the circumferential portion of the discharge port 25 at the base material 26 and the circuit element section with a low loss density and low heat generation ability is mounted in the central portion of the base material 26, the water jacket 2A-0, which has the guide sections 21So-1 and 21So-2, can cool those circuit element sections effectively.

Figure 22:
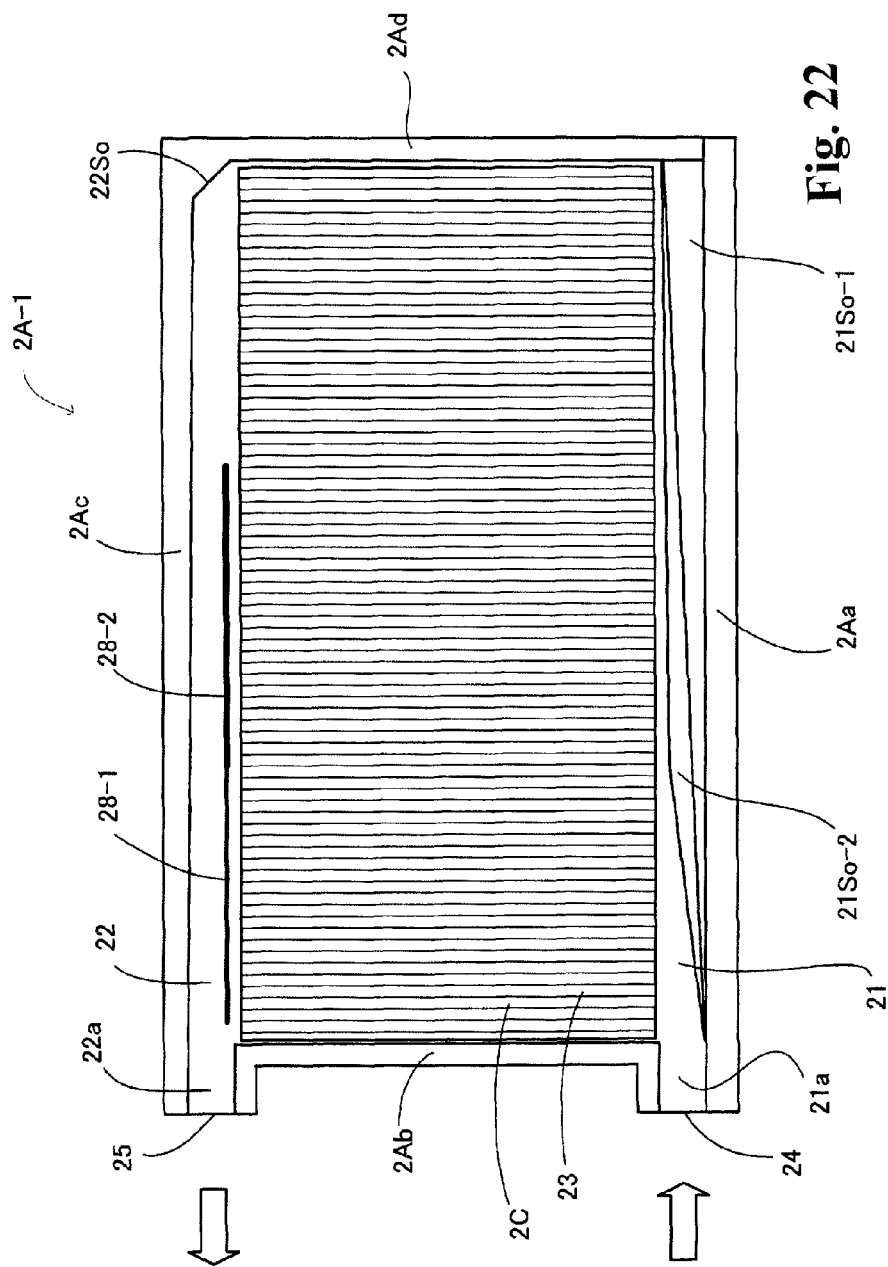
FIG. 22 shows a modification example of the water jacket.

The variation examples of the water jacket 2A-0 will be explained below. FIG. 22 shows a variation example of the water jacket. Only the features different from those illustrated by FIG. 19 will be mainly explained below.

In a water jacket 2A-1 of the first variation example, the introducing port 24 and the discharge port 25 of the water jacket 2A-1 are provided at the same side surface. In the configuration shown in FIG. 22, the introducing port 24 is provided in the lower portion of the left wall 2Ab of the water jacket 2A-1, and the discharge port 25 is provided in the upper portion of the left wall 2Ab. The coolant introduction direction in the introducing port 24 is opposite to the coolant discharge direction in the discharge port 25.

A flow velocity adjusting plate 28-1 is disposed in the coolant discharge flow channel 22 closer to the discharge port 25 at the boundary position of the coolant discharge flow channel 22 and the flow channel 23 for cooling, and a flow velocity adjusting plate 28-2 is disposed adjacently to the flow velocity adjusting plate 28-1 in a substantially central portion of the coolant discharge flow channel 22.

Where the height of the flow velocity adjusting plate 28-1 above the bottom surface of the coolant discharge flow channel 22 is denoted by ha and the height of the flow velocity adjusting plate 28-2 above the bottom surface of the coolant discharge flow channel 22 is denoted by hb, the following condition is fulfilled: ha<hb.

For example, the height ha of the flow velocity adjusting plate 28-1 is about half the length of the fin 2C from the bottom surface of the coolant discharge flow channel 22, and the height hb of the flow velocity adjusting plate 28-2 is substantially the length from the bottom surface of the coolant discharge flow channel 22 to the attachment surface of the fins 2C at the base material 26. Other components, such as guide sections, are basically the same as in the configuration shown in FIG. 19.

In the flow velocity distribution of the water jacket 2A-1, the coolant flow velocity rises at a position close to the left wall 2Ab where the introducing port 24 and the discharge port 25 are disposed, and the coolant flow velocity also rises at a position close to the right wall 2Ad. The rise of the coolant flow velocity in a substantially central portion of the flow channel 23 for cooling is suppressed.

Thus, in the water jacket 2A-1 of the first variation example, the configuration is used such that the introducing port 24 and the discharge port 25 are provided at the same side surface, a plurality of guide sections 21So-1, 21So-2 is provided inside the coolant introducing flow channel 21, and the flow velocity adjusting plates 28-1, 28-2 of different height are disposed at the boundary position of the coolant discharge flow channel 22 and the flow channel 23 for cooling.

As a result, the flow velocity distribution of the coolant flowing in the flow channel 23 for cooling at a position close to one wall side where the introducing port 24 and the discharge port 25 are disposed is raised, and the flow velocity distribution of the coolant flowing in the flow channel 23 for cooling at a position close to the other wall side where the introducing port 24 and the discharge port 25 are not disposed is also raised. In a substantially central portion of the flow channel 23 for cooling, the increase in coolant flow velocity is inhibited.

Where the heat generation distribution of the circuit elements mounted on the base material 26 is taken into account, in the case in which the circuit element sections with a high loss density and high heat generation ability are mounted on the one side where the introducing port 24 and the discharge port 25 of the base material 26 are disposed and on the other side where the introducing port 24 and the discharge port 25 are not disposed and the circuit element section with a low loss density and low heat generation ability is mounted on the central portion of the base material 26, such a drift characteristic makes it possible to cool those circuit elements effectively.

Figure 23:
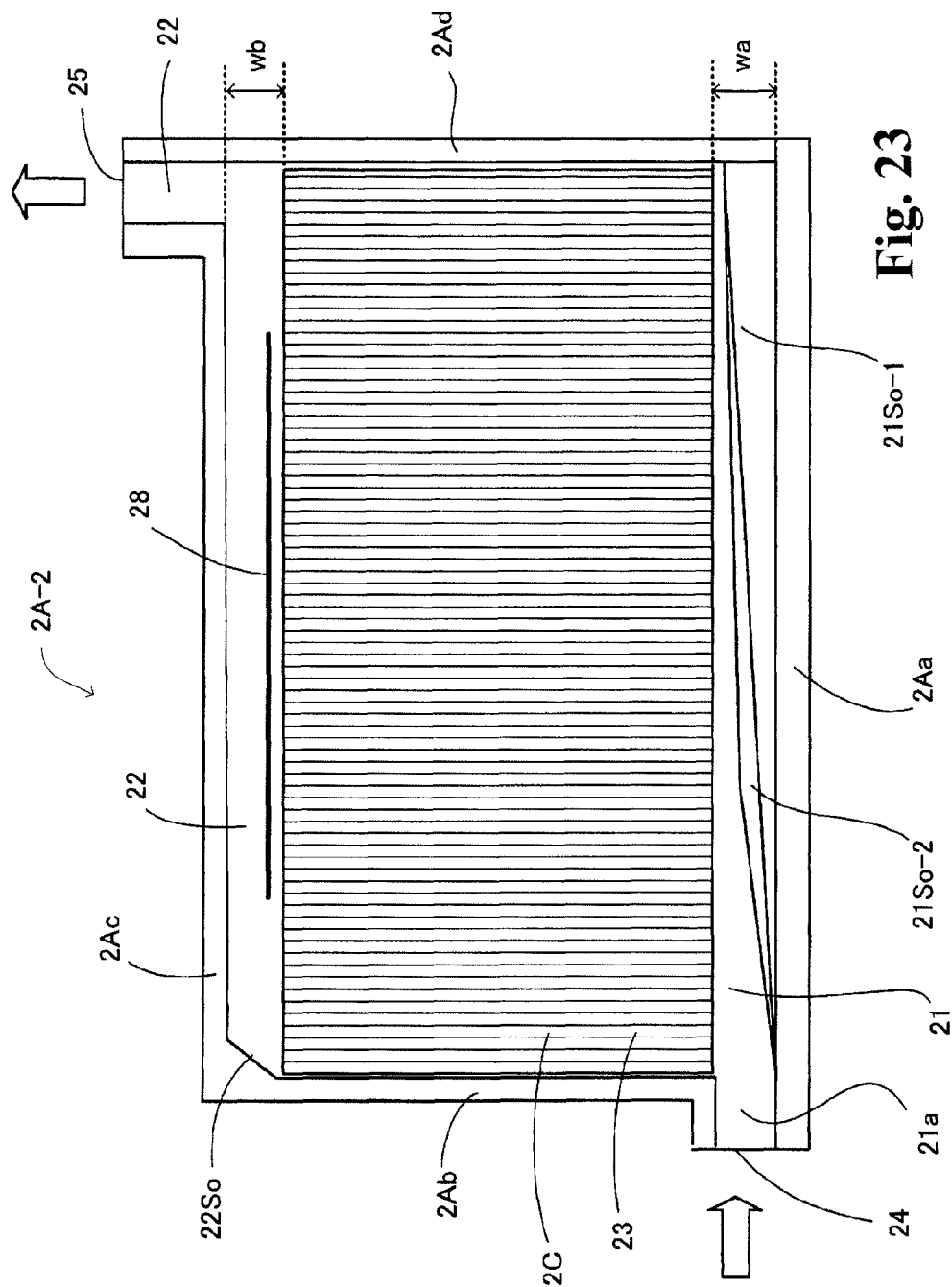
FIG. 23 shows a modification example of the water jacket.

FIG. 23 shows a variation example of the water jacket. Only the features different from those illustrated by FIG. 19 will be mainly explained below. In a water jacket 2A-2 of the second variation example, the introducing port 24 and the discharge port 25 of the water jacket 2A-2 are arranged such that the discharge port 25 is formed at a position diagonally opposite to the position of the introducing port 24 in the water jacket 2A-2. For example, in the configuration shown in FIG. 23, the introducing port 24 is provided in the lower portion of the left wall 2Ab of the water jacket 2A-2, the discharge port 25 is provided in the upper portion of the right wall 2Ad, and the coolant introduction direction of the introducing port 24 is at a right angle with respect to the coolant discharge direction of the discharge port 25. Other components such as a flow velocity adjusting plate and guide sections are basically the same as in the configuration shown in FIG. 19.

Thus, in the water jacket 2A-2 of the second variation example, the introducing port 24 and the discharge port 25 are provided at objective positions, and the coolant introduction direction in the introducing port 24 and the coolant discharge direction in the discharge port 25 are oriented such as to be at a right angle with respect to each other. Further, a configuration is used in which the plurality of guide sections 21So-1, 21So-2 is provided inside the coolant introducing flow channel 21, and the flow velocity adjusting plate 28 is disposed at the boundary position of the coolant discharge flow channel 22 and the flow channel 23 for cooling.

As a result, the flow velocity distribution of the coolant flowing in the flow channel 23 for cooling at a position close to one wall side where the introducing port 24 is disposed is raised, and the flow velocity distribution of the coolant flowing in the flow channel 23 for cooling at a position close to the other wall side where the discharge port 25 is disposed is also raised. Further, in a substantially central portion of the flow channel 23 for cooling, the increase in coolant flow velocity is inhibited.

Where the heat generation distribution of the circuit elements mounted on the base material 26 is taken into account, in the case in which the circuit element sections with a high loss density and high heat generation ability are mounted on the circumferential portion of the introducing port 24 and the circumferential portion of the discharge port 25 at the base material 26 and the circuit element section with a low loss density and low heat generation ability is mounted in the central portion of the base material 26, such a drift characteristic makes it possible to cool those circuit elements effectively.

In FIG. 19 and FIG. 23, the width of the coolant introducing flow channel 21 is denoted by wa and the width of the coolant discharge flow channel 22 is denoted by wb. In the case where wa≤wb, it is preferred that the water jacket 2A-0 shown in FIG. 19 be used. Where wa≥wb, it is preferred that the water jacket 2A-2 shown in FIG. 23 be used.

As described hereinabove, by providing a plurality of guide sections inside the coolant introducing flow channel 21, it is possible to adjust the pressure distribution of the coolant inside the coolant introducing flow channel 21. Therefore, the flow velocity distribution in the flow channel 23 for cooling can be adjusted easily and effectively, and the circuit elements mounted on the base material 26 can be cooled effectively.

The principle of the present invention is explained above in a simple manner. Further, a variety of changes and modifications can be made by a person skilled in the art, the present invention is not limited to the specific configurations and application examples described and illustrated hereinabove, and all corresponding variation examples and equivalents are assumed to be included in the scope of the present invention defined by the appended claims and equivalents thereof.

EXPLANATION OF REFERENCE NUMERALS 2 cooling device
2A water jacket
2B fin base
2C fin
3A to 3I, 3Iu, 3Id circuit element sections
10, 10A semiconductor modules
21 coolant introducing flow channel
21a introducing port section
21Si, 22So guide sections
22 coolant discharge flow channel
22a discharge port section
23 flow channel for cooling
24 introducing port
25 discharge port
26 base material
27 separation wall
28 flow velocity adjusting plate
31 substrate
31a insulating substrate
31b, 31c conductive patterns
32, 33 semiconductor elements 34, 35 joining layers
40 inverter circuit
41 three-phase AC motor
C clearance
B1 to B7 positions of circuit substrate
x width of flow channel for cooling
x2, y2 gaps of flow velocity adjusting plate
w1, w2 flow channel width

What is claimed is:

1. A cooling device for a semiconductor module, comprising:
a water jacket to which a coolant is adapted to be supplied from outside for cooling a semiconductor element disposed outside the water jacket;
a heat sink thermally connected to the semiconductor element;
a first flow channel disposed inside the water jacket and extending from a coolant introducing port, the first flow channel including a plurality of guide sections having mutually different inclined surfaces for guiding the coolant toward one side surface of the heat sink;
a second flow channel disposed inside the water jacket parallel to the first flow channel at a distance therefrom and extending toward a coolant discharge port, the second flow channel being formed with a sidewall parallel to the other side surface of the heat sink;
a flow velocity adjusting plate disposed in the second flow channel and formed parallel to the other side surface of the heat sink at a distance therefrom; and
a third flow channel formed at a position communicating the first flow channel and the second flow channel inside the water jacket,
wherein the heat sink is disposed in the third flow channel, and
the plurality of guide sections is at mutually different heights from a bottom surface of the first flow channel and each guide section has an inclined surface.

2. The cooling device for a semiconductor module according to claim 1, wherein the plurality of guide sections is formed so that the height of the guide section contacting a side surface of the water jacket is the highest, and the guide section disposed at a position closer to the third flow channel has a lower height, and formed in a step shape from the bottom surface of the first flow channel.

3. A cooling device for a semiconductor module, comprising:
a water jacket to which a coolant is adapted to be supplied from outside for cooling a semiconductor element disposed outside the water jacket;
a heat sink thermally connected to the semiconductor element;
a first flow channel disposed inside the water jacket and extending from a coolant introducing port, the first flow channel including a plurality of guide sections having mutually different inclined surfaces for guiding the coolant toward one side surface of the heat sink;
a second flow channel disposed inside the water jacket parallel to the first flow channel at a distance therefrom and extending toward a coolant discharge port, the second flow channel being formed with a sidewall parallel to the other side surface of the heat sink;
a flow velocity adjusting plate disposed in the second flow channel and formed parallel to the other side surface of the heat sink at a distance therefrom; and
a third flow channel formed at a position communicating the first flow channel and the second flow channel inside the water jacket,
wherein the heat sink is disposed in the third flow channel, and
the inclined surfaces of the plurality of guide sections are formed so that a cross-sectional area of the first flow channel decreases in an extending direction of the coolant introducing port.

4. A cooling device for a semiconductor module, comprising:
a water jacket to which a coolant is adapted to be supplied from outside for cooling a semiconductor element disposed outside the water jacket;
a heat sink thermally connected to the semiconductor element;
a first flow channel disposed inside the water jacket and extending from a coolant introducing port, the first flow channel including a plurality of guide sections having mutually different inclined surfaces for guiding the coolant toward one side surface of the heat sink;
a second flow channel disposed inside the water jacket parallel to the first flow channel at a distance therefrom and extending toward a coolant discharge port, the second flow channel being formed with a sidewall parallel to the other side surface of the heat sink;
a flow velocity adjusting plate disposed in the second flow channel and formed parallel to the other side surface of the heat sink at a distance therefrom; and
a third flow channel formed at a position communicating the first flow channel and the second flow channel inside the water jacket,
wherein the heat sink is disposed in the third flow channel, and
the plurality of guide sections includes a first guide section contacting a side surface of the water jacket and a second guide section contacting the first guide section over a section facing the third flow channel, and the plurality of guide sections is formed so that a height of the first guide section is higher than that of the second guide section.

5. The cooling device for a semiconductor module according to claim 4, wherein the inclined surface of the first guide section has uniform inclination with respect to the section facing the third flow channel and is formed so that the cross-sectional area of the first flow channel decreases in the extending direction of the coolant introducing port, and
the inclined surface of the second guide section has a plurality of different inclinations with respect to the section facing the third flow channel and is formed so that the cross-sectional area of the first flow channel decreases in the extending direction of the coolant introducing port.

6. A semiconductor module, comprising:
a water jacket for forming a cooling device, to which a coolant is adapted to be supplied from outside for cooling a semiconductor element disposed on an outer surface of the cooling device;
a heat sink thermally connected to the semiconductor element;
a first flow channel disposed inside the water jacket and extending from a coolant introducing port, the first flow channel including a plurality of guide sections having mutually different inclined surfaces for guiding the coolant toward one side surface of the heat sink;
a second flow channel disposed inside the water jacket parallel to the first flow channel at a distance therefrom and extending toward a coolant discharge port, the second flow channel being formed with a sidewall parallel to the other side surface of the heat sink;

a flow velocity adjusting plate extending from a bottom surface of the heat sink, disposed in the second flow channel and formed parallel to the other side surface of the heat sink with a predetermined space between the flow velocity adjusting plate and the other side surface of the heat sink; and a third flow channel formed at a position communicating the first flow channel and the second flow channel inside the water jacket, wherein the coolant introducing port and the coolant discharge port are formed in a same wall surface of the water jacket, or the coolant discharge port is formed at a position diagonally opposite a position of the coolant introducing port in the water jacket, and the heat sink is disposed in the third flow channel.

7. The semiconductor module according to claim 6, wherein the flow velocity adjusting plate has one end portion positioned at a predetermined distance from an end portion of the second flow channel at a side that the coolant discharge port is present and other end portion positioned at other end portion of the second flow channel.

8. The semiconductor module according to claim 6, wherein the flow velocity adjusting plate has a length equal to a length of the second flow channel so as to cover an entire other side surface of the heat sink.

9. A semiconductor module, comprising:
a water jacket for forming a cooling device, to which a coolant is adapted to be supplied from outside for cooling a semiconductor element disposed outside the water jacket;
a heat dissipating device thermally connected to the semiconductor element;
a first flow channel device disposed inside the water jacket and extending from a coolant introducing port, the first flow channel device including a guide device having an inclined surface for guiding the coolant toward one side surface of the heat dissipating device;
a second flow channel device disposed inside the water jacket parallel to the first flow channel device at a distance therefrom and extending toward a coolant discharge port, the second flow channel device being formed with a sidewall parallel to the other side surface of the heat dissipating device;
a flow velocity adjusting device extending from a bottom surface of the heat dissipating device, disposed in the second flow channel device and formed parallel to the other side surface of the heat dissipating device with a predetermined space between the flow velocity adjusting device and the other side surface of the heat dissipating device; and
a third flow channel device formed at a position communicating the first flow channel device and the second flow channel device inside the water jacket,
wherein the coolant introducing port and the coolant discharge port are formed in a same wall surface of the water jacket, and the heat dissipating device is disposed in the third flow channel device.

10. The semiconductor module according to claim 9, wherein the flow velocity adjusting device has one end portion positioned at a predetermined distance from an end portion of the second flow channel device at a side that the coolant discharge port is present and other end portion positioned at other end portion of the second flow channel device.

11. The semiconductor module according to claim 9, wherein the flow velocity adjusting device has a length equal to a length of the second flow channel device so as to cover an entire other side surface of the heat dissipating device.

12. A cooling device for a semiconductor module, comprising:
a water jacket to which a coolant is adapted to be supplied from outside for cooling a semiconductor element disposed outside the water jacket;
a heat dissipating device thermally connected to the semiconductor element;
a first flow channel device disposed inside the water jacket and extending from a coolant introducing port, the first flow channel device including a plurality of guide devices having mutually different inclined surfaces for guiding the coolant toward one side surface of the heat dissipating device;
a second flow channel device disposed inside the water jacket parallel to the first flow channel device at a distance therefrom and extending toward a coolant discharge port, the second flow channel device being formed with a sidewall parallel to the other side surface of the heat dissipating device;
a flow velocity adjusting device disposed in the second flow channel device and formed parallel to the other side surface of the heat dissipating device at a distance therefrom; and
a third flow channel device formed at a position communicating the first flow channel device and the second flow channel device inside the water jacket,
wherein the heat dissipating device is disposed in the third flow channel device, and
the inclined surfaces of the plurality of guide devices are formed so that a cross-sectional area of the first flow channel device decreases in an extending direction of the coolant introducing port.

13. The cooling device for a semiconductor module according to claim 12, wherein the plurality of guide devices is at mutually different heights from a bottom surface of the first flow channel device, and each guide device has an inclined surface.

14. The cooling device for a semiconductor module according to claim 13, wherein the plurality of guide devices is formed so that the height of the guide device contacting a side surface of the water jacket is the highest, and the guide device disposed at a position closer to the third flow channel device has a lower height, and formed in a step shape from the bottom surface of the first flow channel device.

15. A cooling device for a semiconductor module, comprising:
a water jacket to which a coolant is adapted to be supplied from outside for cooling a semiconductor element disposed outside the water jacket;
a heat dissipating device thermally connected to the semiconductor element;
a first flow channel device disposed inside the water jacket and extending from a coolant introducing port, the first flow channel device including a plurality of guide devices having mutually different inclined surfaces for guiding the coolant toward one side surface of the heat dissipating device;
a second flow channel device disposed inside the water jacket parallel to the first flow channel device at a distance therefrom and extending toward a coolant discharge port, the second flow channel device being formed with a sidewall parallel to the other side surface of the heat dissipating device;
a flow velocity adjusting device disposed in the second flow channel device and formed parallel to the other side surface of the heat dissipating device at a distance therefrom; and a third flow channel device formed at a position communicating the first flow channel device and the second flow channel device inside the water jacket, wherein the heat dissipating device is disposed in the third flow channel device, and the plurality of guide devices includes a first guide device contacting a side surface of the water jacket and a second guide device contacting the first guide device over a section facing the third flow channel device, and the plurality of guide devices is formed so that the height of the first guide device is higher than that of the second guide device.

16. The cooling device for a semiconductor module according to claim 15, wherein the inclined surface of the first guide device has uniform inclination with respect to the section facing the third flow channel device and is formed so that the cross-sectional area of the first flow channel device decreases in the extending direction of the coolant introducing port, and the inclined surface of the second guide device has a plurality of different inclinations with respect to the section facing the third flow channel device and is formed so that the cross-sectional area of the first flow channel device decreases in the extending direction of the coolant introducing port.

17. A semiconductor module comprising:

a water jacket for forming a cooling device, to which a coolant is adapted to be supplied from outside for cooling a semiconductor element disposed outside the water jacket;

a heat dissipating device thermally connected to the semiconductor element;

a first flow channel device disposed inside the water jacket and extending from a coolant introducing port, the first flow channel device including a plurality of guide devices having mutually different inclined surfaces for guiding the coolant toward one side surface of the heat dissipating device;

a second flow channel device disposed inside the water jacket parallel to the first flow channel device at a distance therefrom and extending toward a coolant discharge port, the second flow channel device being formed with a sidewall parallel to the other side surface of the heat dissipating device;

a flow velocity adjusting device extending from a bottom surface of the heat dissipating device, disposed in the second flow channel device and formed parallel to the other side surface of the heat dissipating device with a predetermined space between the flow velocity adjusting device and the other side surface of the heat dissipating device; and a third flow channel device formed at a position communicating the first flow channel device and the second flow channel device inside the water jacket, wherein the coolant introducing port and the coolant discharge port are formed in a same wall surface of the water jacket, or the coolant discharge port is formed at a position diagonally opposite a position of the coolant introducing port in the water jacket, and the heat dissipating device is disposed in the third flow channel device.

18. The semiconductor module according to claim 17, wherein the flow velocity adjusting device has one end portion positioned at a predetermined distance from an end portion of the second flow channel device at a side that the coolant discharge port is present and other end portion positioned at other end portion of the second flow channel device.

19. The semiconductor module according to claim 17, wherein the flow velocity adjusting device has a length equal to a length of the second flow channel device so as to cover an entire other side surface of the heat dissipating device.

* * * * *

UNITED STATES PATENT AND TRADEMARK OFFICE
CERTIFICATE OF CORRECTION

PATENT NO.            : 9,245,821 B2
APPLICATION NO.       : 14/347153
DATED                 : January 26, 2016
INVENTOR(S)           : Hiromichi Gohara et al.

It is certified that error appears in the above-identified patent and that said Letters Patent is hereby corrected as shown below:

In the specification

Please change column 9, line 44, from "... fin base 25 ..." to --... fin base 2B ...--.

Please change column 10, line 7, from "... tin base 2B" to --... fin base 2B--.

Please change column 14, line 27, from "... cooling device" to --... cooling device 2--.

Please change column 15, line 30, from "... flow channel ..." to --... flow channel 23 ...--.

Please change column 23, line 10, from "... introducing port..." to --... introducing port 24 ...--.

Signed and Sealed this
Tenth Day of May, 2016

Michelle K. Lee
*Director of the United States Patent and Trademark Office*